(12) United States Patent
Yang

(10) Patent No.: US 9,032,278 B2
(45) Date of Patent: *May 12, 2015

(54) METHOD FOR PERFORMING DATA SHAPING, AND ASSOCIATED MEMORY DEVICE AND CONTROLLER THEREOF

(71) Applicant: Silicon Motion Inc., Hsinchu County (TW)

(72) Inventor: Tsung-Chieh Yang, Hsinchu (TW)

(73) Assignee: Silicon Motion Inc., Jhubei, Hsinchu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/197,175

(22) Filed: Mar. 4, 2014

(65) Prior Publication Data

US 2014/0189222 A1  Jul. 3, 2014

Related U.S. Application Data

(62) Division of application No. 13/115,980, filed on May 25, 2011, now Pat. No. 8,762,823.

(30) Foreign Application Priority Data

Sep. 9, 2010 (TW) .................................. 099130478

(51) Int. Cl.
| | |
|---|---|
| H03M 13/03 | (2006.01) |
| G11C 29/00 | (2006.01) |
| G06F 12/02 | (2006.01) |
| G11C 7/10 | (2006.01) |
| G11C 11/56 | (2006.01) |
| G11C 16/10 | (2006.01) |
| G11C 16/26 | (2006.01) |

(52) U.S. Cl.
CPC .......... *G06F 12/0246* (2013.01); *G11C 7/1006* (2013.01); *G11C 11/5628* (2013.01); *G11C 11/5642* (2013.01); *G11C 16/10* (2013.01); *G11C 16/26* (2013.01)

(58) Field of Classification Search
CPC ... G06F 12/0246; G06F 12/14; G11C 7/1006; G11C 16/10; G11C 11/5628
USPC .......... 714/773, E11.034, 792, 796, 795, 763, 714/718, 719; 711/E12.008, 154, 163, 103; 365/185.33, 230.03
See application file for complete search history.

(56) References Cited

U.S. PATENT DOCUMENTS

| | | | |
|---|---|---|---|
| 5,027,374 A | 6/1991 | Rossman | |
| 7,730,528 B2 * | 6/2010 | Chun et al. | 726/12 |
| 7,924,613 B1 * | 4/2011 | Sommer et al. | 365/185.03 |
| 7,925,936 B1 * | 4/2011 | Sommer | 714/704 |
| 8,112,698 B2 | 2/2012 | Nguyen | |
| 8,176,401 B1 | 5/2012 | Yang | |
| 8,595,591 B1 * | 11/2013 | Shalvi et al. | 714/763 |
| 2007/0266303 A1 | 11/2007 | Shih | |

(Continued)

*Primary Examiner* — Phung M Chung
(74) *Attorney, Agent, or Firm* — Winston Hsu; Scott Margo

(57) ABSTRACT

A method for performing data shaping is applied to a controller of a Flash memory, where the Flash memory includes a plurality of blocks. The method includes: performing a program optimization operation according to original data and a plurality of shaping codes, in order to generate trace back information corresponding to a Trellis diagram and utilize the trace back information as side information; and dynamically selecting at least one shaping code from the shaping codes according to the side information to perform data shaping on the original data.

3 Claims, 14 Drawing Sheets

(56) References Cited

U.S. PATENT DOCUMENTS

| | | |
|---|---|---|
| 2008/0162791 A1 | 7/2008 | Eldredge |
| 2009/0094505 A1 | 4/2009 | Nguyen |
| 2009/0129169 A1 | 5/2009 | Roohparvar |
| 2009/0132755 A1 | 5/2009 | Radke |
| 2009/0132889 A1 | 5/2009 | Radke |
| 2009/0240872 A1* | 9/2009 | Perlmutter et al. ........... 711/103 |
| 2010/0157675 A1* | 6/2010 | Shalvi et al. ............. 365/185.03 |
| 2010/0199149 A1 | 8/2010 | Weingarten |
| 2010/0217921 A1* | 8/2010 | Mun ............................. 711/103 |
| 2012/0005409 A1 | 1/2012 | Yang |

\* cited by examiner

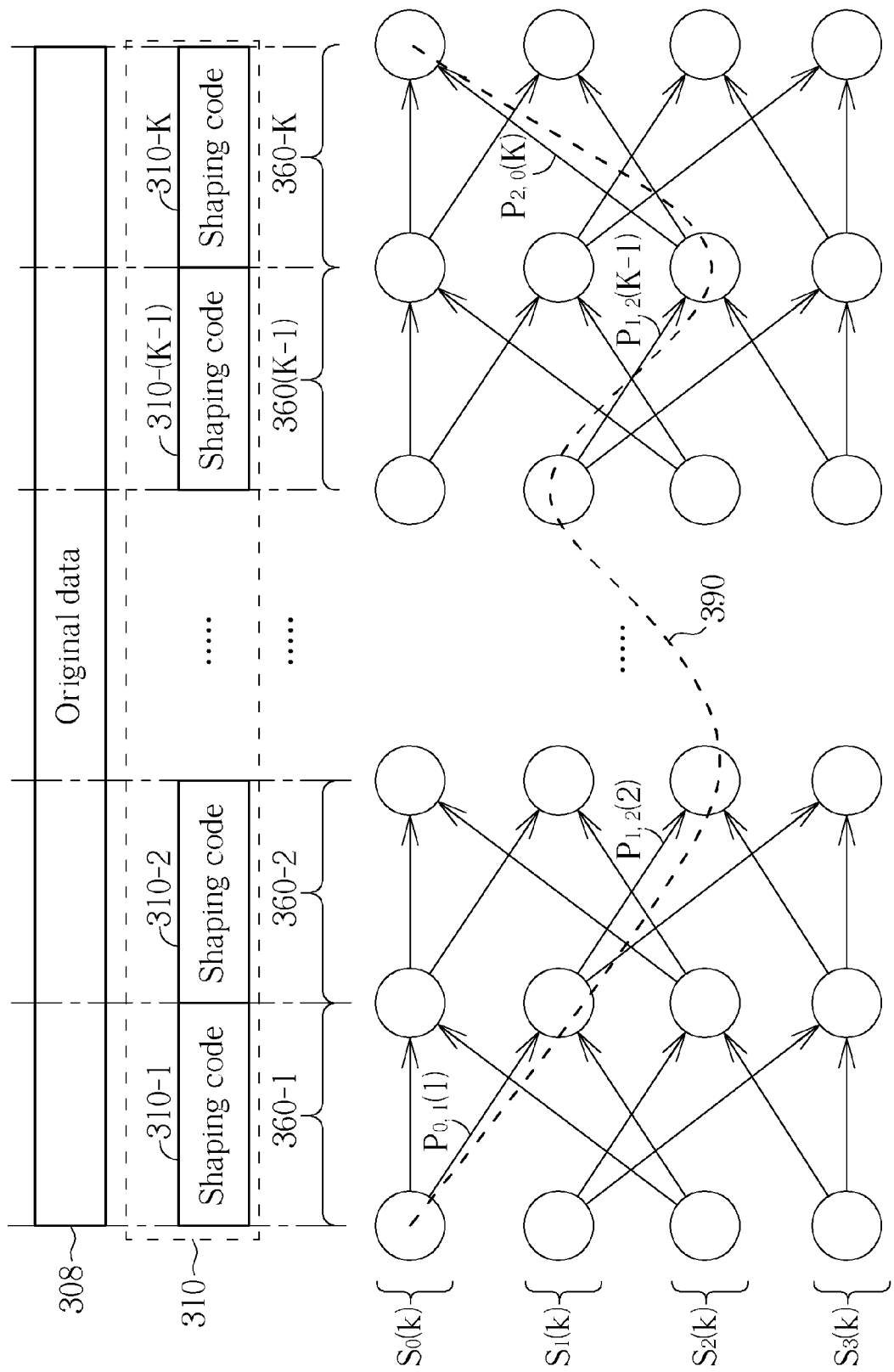

METHOD FOR PERFORMING DATA SHAPING, AND ASSOCIATED MEMORY DEVICE AND CONTROLLER THEREOF

CROSS REFERENCE TO RELATED APPLICATIONS

This divisional application claims the benefit of co-pending U.S. patent application Ser. No. 13/115,980, filed on May 25, 2011, and incorporated herein by reference.

BACKGROUND OF THE INVENTION

1. Field of the Invention

The present invention relates to access to a Flash memory, and more particularly, to a method for performing data shaping, and to an associated memory device and a controller thereof.

2. Description of the Prior Art

As technologies of Flash memories progress in recent years, many kinds of portable memory devices (e.g. memory cards respectively complying with SD/MMC, CF, MS, and XD standards) or solid state drives (SSDs) equipped with Flash memories are widely implemented in various applications. Therefore, the control of access to Flash memories in these memory devices has become an important issue.

Taking NAND Flash memories as an example, they can mainly be divided into two types, i.e. Single Level Cell (SLC) Flash memories and Multiple Level Cell (MLC) Flash memories. Each transistor that is considered a memory cell in SLC Flash memories only has two charge levels that respectively represent a logical value 0 and a logical value 1. In addition, the storage capability of each transistor that is considered a memory cell in MLC Flash memories can be fully utilized. More specifically, the voltage for driving memory cells in the MLC Flash memories is typically higher than that in the SLC Flash memories, and different voltage levels can be applied to the memory cells in the MLC Flash memories in order to record information of at least two bits (e.g. binary values 00, 01, 11, or 10) in a transistor that is considered a memory cell. Theoretically, the storage density of the MLC Flash memories may reach twice the storage density of the SLC Flash memories, which is considered good news for NAND Flash memory manufacturers who encountered a bottleneck of NAND Flash technologies.

As MLC Flash memories are cheaper than SLC Flash memories, and are capable of providing higher capacity than SLC Flash memories while the space is limited, MLC Flash memories have been a main stream for implementation of most portable memory devices on the market. However, various problems of the MLC Flash memories have arisen due to their unstable characteristics. In order to ensure that the access control of a memory device over the Flash memory therein can comply with related standards, the controller of the Flash memory should have some handling mechanisms in order to properly handle its data access operations.

According to the related art, the memory device having the aforementioned handling mechanisms may still suffer from some deficiencies. For example, due to usage behaviors of the user, data of some specific data patterns would probably be constantly written into the Flash memory, where these specific data patterns may easily cause errors such as write/program errors, read errors, etc. Although the memory device may be equipped with a randomizer for adjusting data in order to solve such a problem, the data after adjustment is typically not random enough due to the conventional low cost design.

In addition, when there are some limitations regarding data storage patterns of the Flash memory, a problem of the tradeoff between insufficient hardware resources and increased costs may occur. Therefore, a novel method is required for performing data pattern management regarding data accessed by the controller in order to reduce the probability of error occurrence.

SUMMARY OF THE INVENTION

It is therefore an objective of the claimed invention to provide a method for performing data shaping, and to provide an associated memory device and a controller thereof, in order to solve the above-mentioned problems.

It is another objective of the claimed invention to provide a method for performing data shaping, and to provide an associated memory device and a controller thereof, in order to suppress errors.

It is another objective of the claimed invention to provide a method for performing data shaping, and to provide an associated memory device and a controller thereof, in order to rapidly sieve out shaping codes that are suitable for use from candidate shaping codes for performing data shaping in a situation where the candidate shaping codes are many, without implementing a large number of components in hardware architecture.

According to a preferred embodiment of the claimed invention, a method for performing data shaping is provided. The method is applied to a controller of a Flash memory, where the Flash memory comprises a plurality of blocks. The method comprises: performing a program optimization operation according to original data and a plurality of shaping codes, in order to generate trace back information corresponding to a Trellis diagram and utilize the trace back information as side information; and dynamically selecting at least one shaping code from the shaping codes according to the side information to perform data shaping on the original data.

While the method mentioned above is disclosed, an associated memory device is further provided. The memory device comprises: a Flash memory comprising a plurality of blocks; and a controller arranged to access the Flash memory and manage the plurality of blocks, and further perform data shaping regarding data accessed by the controller itself. In addition, the controller performs a program optimization operation according to original data and a plurality of shaping codes, in order to generate trace back information corresponding to a Trellis diagram and utilize the trace back information as side information. Additionally, the controller comprises at least one data shaping module/data recovery module arranged to dynamically select at least one shaping code from the shaping codes according to the side information to perform data shaping on the original data.

While the method mentioned above is disclosed, a controller of a memory device is further provided, wherein the controller is utilized for accessing a Flash memory comprising a plurality of blocks. The controller comprises: a read only memory (ROM) arranged to store a program code; a microprocessor arranged to execute the program code to control access to the Flash memory and manage the plurality of blocks, wherein under control of the microprocessor, the controller performs data shaping regarding data accessed by the controller itself. In addition, the controller performs a program optimization operation according to original data and a plurality of shaping codes, in order to generate trace back information corresponding to a Trellis diagram and utilize the trace back information as side information. Additionally, the controller further comprises at least one data shaping module/ data recovery module arranged to dynamically select at least one shaping code from the shaping codes according to the side information to perform data shaping on the original data.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3A-3C illustrate some implementation details of the program optimization operation involved with the method shown in FIG. 2 according to an embodiment of the present invention, where FIG. 3C further illustrates some shaping codes utilized by the data shaping module shown in FIG. 1A during data shaping.

DETAILED DESCRIPTION

Figure 1A:
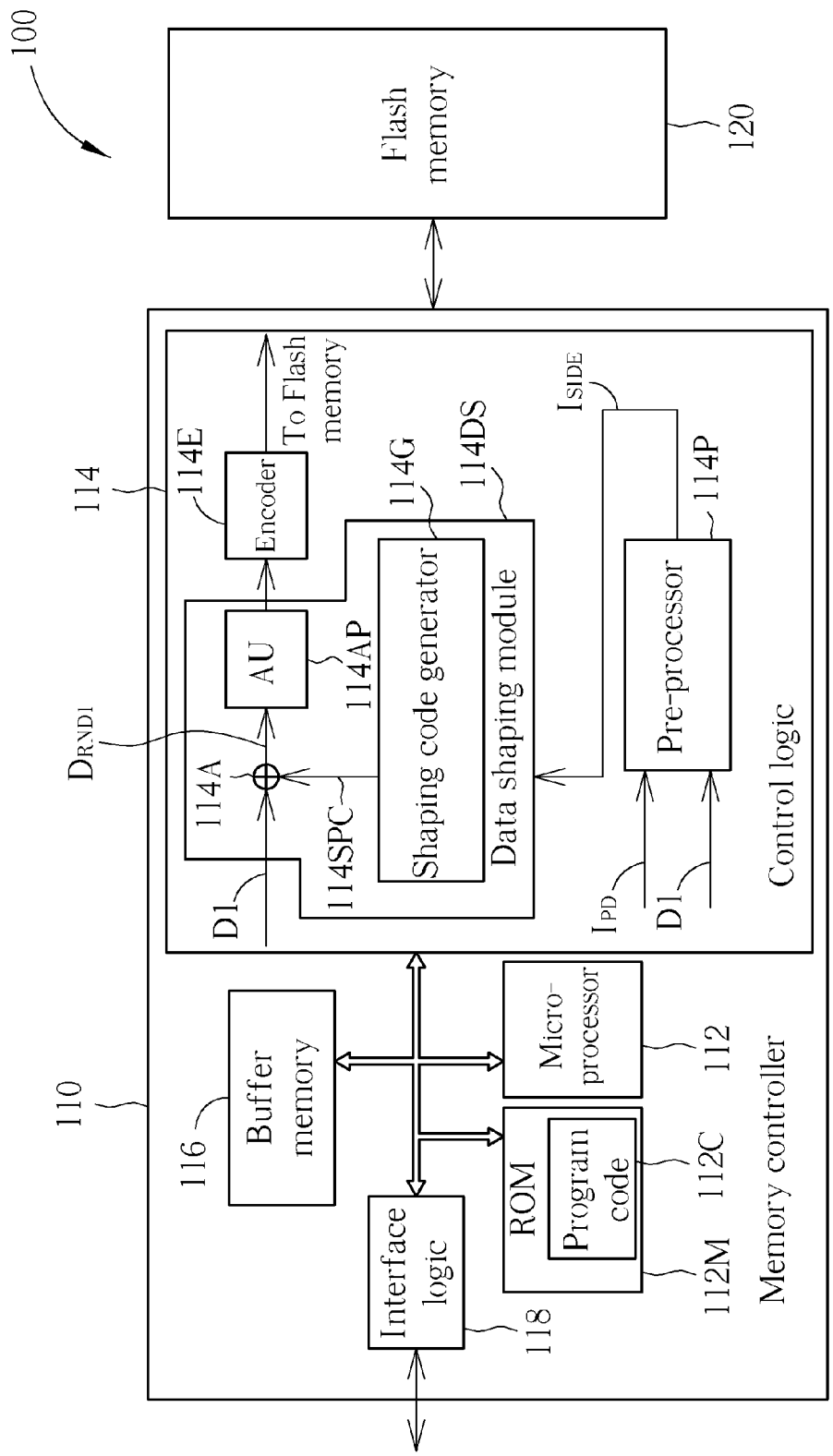
FIG. 1A is a diagram of a memory device according to a first embodiment of the present invention.

Please refer to FIG. 1A, which illustrates a diagram of a memory device 100 according to a first embodiment of the present invention. In particular, the memory device 100 of this embodiment is a portable memory device, examples of which may include, but not limited to, memory cards complying with SD/MMC, CF, MS, or XD standards, and Universal Serial Bus (USB) Flash drives (which can be referred to as USB Flash disks). The memory device 100 comprises a Flash memory 120, and further comprises a controller arranged to access the Flash memory 120, where the aforementioned controller of this embodiment is a memory controller 110. According to this embodiment, the memory controller 110 comprises a microprocessor 112, a read only memory (ROM) 112M, a control logic 114, a buffer memory 116, and an interface logic 118. In addition, the control logic 114 comprises at least one data shaping module/data recovery module, such as a data shaping module 114DS, and further comprises an encoder 114E and a pre-processor 114P, where the data shaping module 114DS comprises an adjustment unit 114A, an appending unit 114AP (labeled "AU" in FIG. 1A), and a shaping code generator 114G. In practice, the adjustment unit 114A can be an exclusive OR (XOR) gate or an adder. Please note that the portable memory device is taken as an example of the memory device 100 in this embodiment. This is for illustrative purposes only, and is not meant to be a limitation of the present invention. According to a variation of this embodiment, the memory device 100 can be a solid state drive (SSD).

In this embodiment, the ROM 112M is arranged to store a program code 112C, and the microprocessor 112 is arranged to execute the program code 112C to control the access to the Flash memory 120. Typically, the Flash memory 120 comprises a plurality of blocks, and the controller (e.g. the memory controller 110 that executes the program code 112C by utilizing the microprocessor 112) can perform data erasure operations on the Flash memory 120 by erasing in units of blocks. In addition, a block can be utilized for recording a specific amount of pages, where the controller mentioned above can perform data writing operations on the Flash memory 120 by writing/programming in units of pages.

In practice, the memory controller 110 that executes the program code 112C by utilizing the microprocessor 112 is capable of performing various control operations by utilizing the internal components within the memory controller 110. For example, the memory controller 110 utilizes the control logic 114 to control access to the Flash memory 120 (e.g. operations of accessing at least one block or at least one page), utilizes the buffer memory 116 to perform buffering operations for the memory controller 110, and utilizes the interface logic 118 to communicate with a host device. According to this embodiment, in addition to accessing the Flash memory 120, the memory controller 110 is capable of properly managing the plurality of blocks.

In addition, the memory controller 110 can further perform data shaping regarding data accessed by the memory controller 110 itself (e.g. the data D1 shown in FIG. 1A). More particularly, under control of the microprocessor 112, the memory controller 110 can perform data shaping by utilizing operations of the aforementioned at least one data shaping module/data recovery module (e.g. the data shaping module 114DS) to suppress errors regarding the data accessed by the memory controller 110 itself. More specifically, the controller (and more particularly, the pre-processor 114P therein in this embodiment) performs a program optimization operation according to a plurality of shaping codes and original data such as the data D1, in order to generate trace back information corresponding to a Trellis diagram and utilize the trace back information as side information $I_{SIDE}$, and the aforementioned at least one data shaping module/data recovery module (e.g. the data shaping module 114DS) dynamically selects at least one shaping code from the shaping codes according to the side information $I_{SIDE}$ to perform data shaping on the original data.

In this embodiment, the pre-processor 114P can generate the side information $I_{SIDE}$ according to the data D1 and the previous data information $I_{PD}$ (i.e. the information of previous data, such as the information stored in the previous memory page within the Flash memory), where the controller can utilize at least one portion (e.g. a portion or all) of the side information $I_{SIDE}$ or representative information of the aforementioned at least one portion of the side information $I_{SIDE}$ to perform related operations when the controller receives a write/read command, and the write/read command is utilized for instructing the controller to write the data into/read the data from the Flash memory 120. For example, in a situation where the aforementioned write/read command represents a write command, the controller can immediately utilize the side information $I_{SIDE}$ to perform data shaping. More specifically, according to the aforementioned at least one portion of the side information $I_{SIDE}$ or the representative information thereof, the shaping code generator 114G can generate at least one shaping code, such as one or more corresponding shaping codes 114SPC, for use of adjusting a plurality of bits of the original data (e.g. the data D1) when the controller receives the write command. In addition, the adjustment unit 114A adjusts the data D1 according to the aforementioned at least one shaping code to generate the adjusted data such as the data $D_{RND1}$. Additionally, the appending unit 114AP can append the aforementioned at least one portion of the side information $I_{SIDE}$ or the representative information thereof to the data $D_{RND1}$ as the appended information $I_A$ thereof. Thus, the encoder 114E can perform encoding on the data $D_{RND1}$ together with the appended information $I_A$. Therefore, during a write operation, the controller can store the data in the Flash memory 120, and further store the aforementioned at least one portion of the side information $I_{SIDE}$ or the representative information thereof into the Flash memory 120, for use of recovery of the original data. As a result, in a situation where the aforementioned write/read command represents a read command, during a read operation, the controller can obtain the aforementioned at least one portion of the side information $I_{SIDE}$ or the representative information thereof from the Flash memory 120, and the aforementioned at least one data shaping module/data recovery module (e.g. the data shaping module 114DS) can recover the original data such as the data D1 accordingly (and more particularly, according to the aforementioned at least one portion of the side information $I_{SIDE}$ or the representative information thereof obtained from the Flash memory 120).

Please note that, according to a special case of this embodiment, the data shaping module 114DS can be utilized as a data recovery module, which is capable of recovering data during a read operation. More particularly, the adjustment unit 114A and the shaping code generator 114G in the data shaping module 114DS can be utilized for recovering data during a read operation, where the appending unit 114AP can be temporarily disconnected from the adjustment unit 114A by performing path switching with switching circuits, so the appending unit 114AP is temporarily not electrically connected to the adjustment unit 114A. According to another special case of this embodiment, in addition to the data shaping module 114DS, the aforementioned at least one data shaping module/data recovery module may further comprise a data recovery module, which is capable of recovering data during a read operation. Thus, the memory controller 110 can support performing both write and read operations at the same time. For example, the data recovery module can utilize the adjustment unit 114A and/or the shaping code generator 114G by performing path switching with switching circuits. In another example, the data recovery module may comprise its own adjustment unit. In another example, the data recovery module may comprise its own shaping code generator.

According to this embodiment, in a situation where the aforementioned write/read command represents the write command, when the data path passing through the adjustment unit 114A represents a write path, the data D1 may represent the original data to be written into the Flash memory 120 by the controller, and the data $D_{RND1}$ may represent the adjusted data, and the data $D_{RND1}$ and the appended information $I_A$ are sent to the encoder 114E. As a result, the encoder 114E performs encoding according to the data $D_{RND1}$ and the appended information $I_A$, and more particularly, performs Error Correction Code (ECC) encoding to generate encoded data, and writes the encoded data into the Flash memory 120, where the encoded data may comprise parity codes. This is for illustrative purposes only, and is not meant to be a limitation of the present invention. According to a special case of this embodiment, such as the special case in which the aforementioned data shaping module 114DS can be utilized as the data recovery module, in a situation where the write/read command mentioned above represents the read command, when the data path passing through the adjustment unit 114A represents a read path, the read path can be coupled to a decoder 114D (not shown in FIG. 1A), where the decoder 114D performs decoding on encoded data read from the Flash memory 120, and more particularly, performs ECC decoding to generate decoded data such as the data $D_{RND1}$ and the appended information $I_A$ (i.e. the aforementioned at least one portion of the side information $I_{SIDE}$ or the representative information thereof). In this situation, the input and output of the adjustment unit 114A shown in FIG. 1A are exchanged, and the adjustment unit 114A adjusts the data $D_{RND1}$ according to at least one shaping code, such as one or more corresponding shaping codes 114SPC, in order to recover the data D1 for further processing.

According to a variation of this embodiment, the program optimization operation can be implemented by utilizing at least one program module in the program code 112C. Thus, the pre-processor 114P can be replaced with the memory controller 110 that executes the program module by utilizing the microprocessor 112.

Figure 1B:
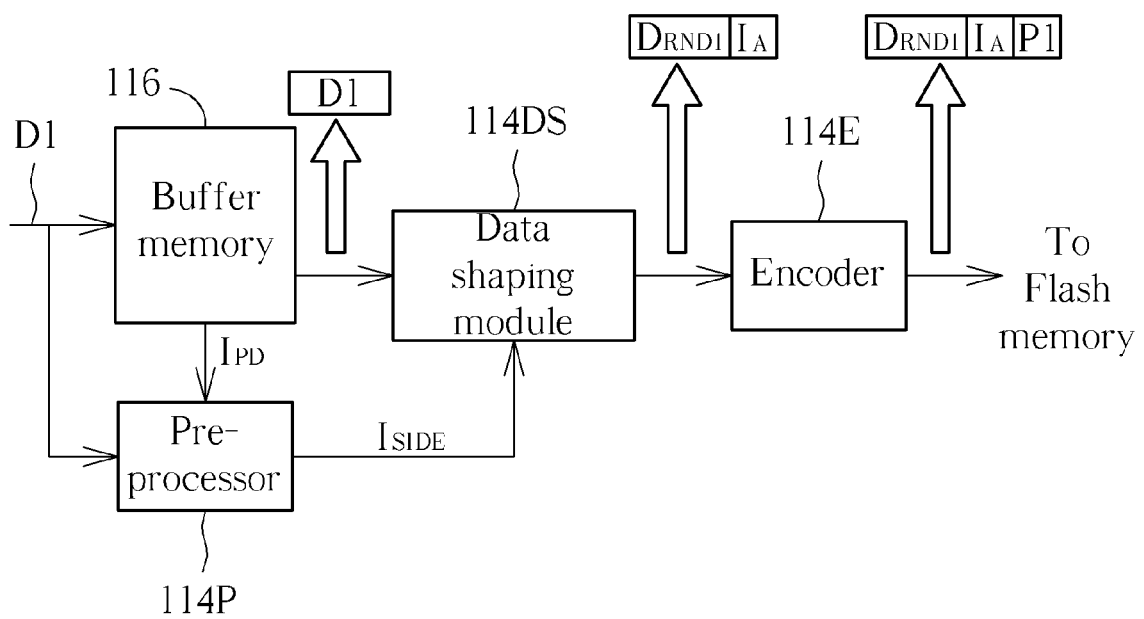
FIGS. 1B-1C illustrate some implementation details of the memory device shown in FIG. 1A according to an embodiment of the present invention.
Figure 1C:
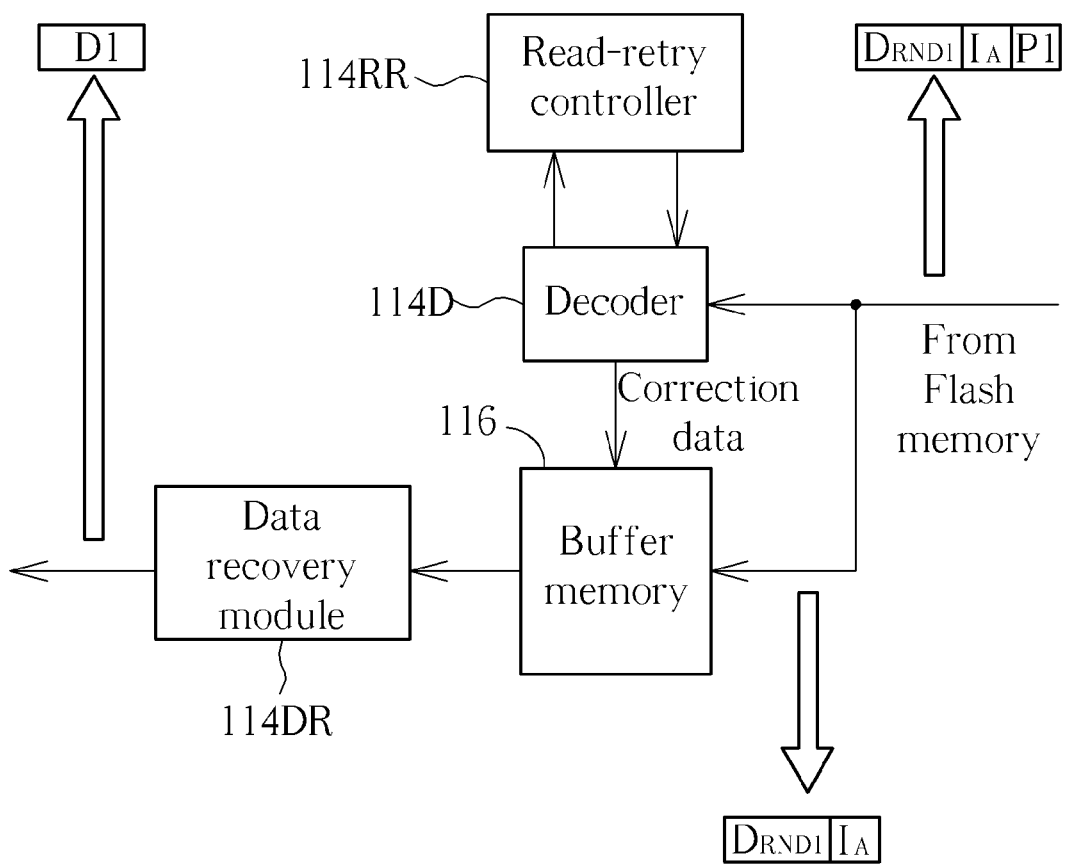

FIGS. 1B-1C illustrate some implementation details of the memory device 100 shown in FIG. 1A according to an embodiment of the present invention. As shown in FIG. 1B, in a situation where the aforementioned write/read command represents the write command, the pre-processor 114P reads the previous data information $I_{PD}$ from the buffer memory 116, and performs the program optimization operation according to the data D1 and the previous data information $I_{PD}$ to generate the side information $I_{SIDE}$. In addition, the data shaping module 114DS reads the data D1 from the buffer memory 116 and dynamically selects at least one shaping code from the shaping codes according to the side information $I_{SIDE}$, in order to perform data shaping on the data D1 to generate the data $D_{RND1}$. Thus, according to the side information $I_{SIDE}$, the data shaping module 114DS generates at least one shaping code, such as one or more corresponding shaping codes 114SPC, and adjusts a plurality of bits of the data D1 bit by bit according to the one or more corresponding shaping codes 114SPC in order to generate the adjusted data such as the data $D_{RND1}$. The data shaping module 114DS further appends the appended information $I_A$ to the data $D_{RND1}$ to generate combination data (which is illustrated as the data $D_{RND1}$ appended with the appended information $I_A$ in FIG. 1B). Additionally, the encoder 114E performs ECC encoding on the combination data to generate encoded data (which is illustrated as the data $D_{RND1}$ appended with the appended information $I_A$ and the parity code P1 around the upper right corner in FIG. 1B), and writes the encoded data to the Flash memory 120.

As shown in FIG. 1C, in a situation where the write/read command mentioned above represents the read command, the encoded data that the memory controller 110 reads from the Flash memory 120 (which is illustrated as the data $D_{RND1}$ appended with the appended information $I_A$ and the parity code P1 around the upper right corner in FIG. 1C) is respectively sent to the decoder 114D and the buffer memory 116, where under control of the memory controller 110, the buffer memory 116 only temporarily stores the data $D_{RND1}$ and the appended information $I_A$, rather than the parity code P1. The read-retry controller 114RR is arranged to perform read-retry control when the decoder 114D performs decoding. In addition, the decoder 114D performs decoding on the encoded data read from the Flash memory 120, and once any error is detected, the decoder 114D generates correction data to correct the data $D_{RND1}$ in the buffer memory 116 and/or the appended information $I_A$. As a result, the data recovery module 114DR recovers the data D1 according to the appended information $I_A$ (i.e. the aforementioned at least one portion of the side information $I_{SIDE}$ or the representative information thereof). According to this embodiment, the data recovery module 114DR can generate at least one shaping code such as one or more corresponding shaping codes 114SPC according to the appended information $I_A$, and adjusts a plurality of bits of the data $D_{RND1}$ bit by bit according to the one or more corresponding shaping codes 114SPC in order to recover the data D1 for further processing.

According to a variation of this embodiment, the data shaping module 114DS and the data recovery module 114DR can be the same component, and therefore, they can be collectively referred to as the data shaping module/data recovery module.

Figure 1D:
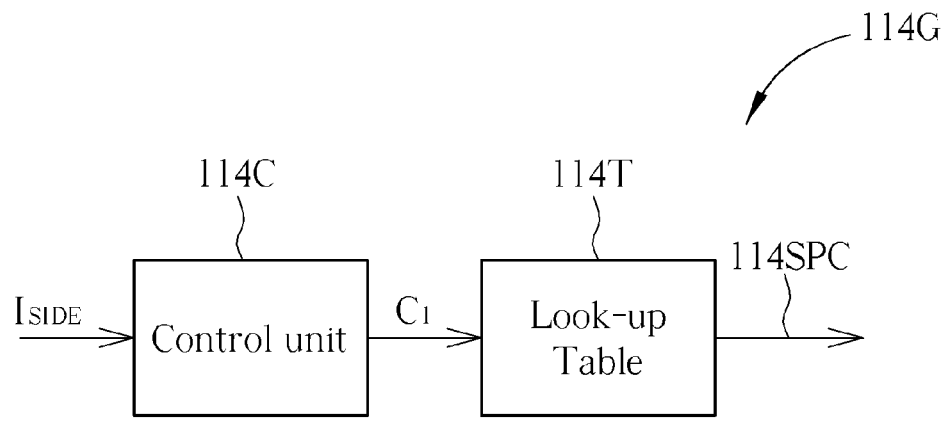
FIGS. 1D-1E illustrate some implementation details of the shaping code generator shown in FIG. 1A according to different embodiments of the present invention.

FIG. 1D illustrates some implementation details of the shaping code generator 114G shown in FIG. 1A according to an embodiment of the present invention. The shaping code generator 114G of this embodiment comprises a control unit 114C and a look-up table 114T, where the look-up table 114T stores the plurality of shaping codes. As the plurality of shaping codes comprises the aforementioned one or more shaping codes 114SPC, any of the one or more shaping codes 114SPC can be selected from the plurality of shaping codes.

In this embodiment, according to the side information $I_{SIDE}$, the control unit 114C can generate a corresponding control signal $C_1$, and perform table look-up by utilizing the look-up table 114T in order to generate the one or more shaping codes 114SPC. This is for illustrative purposes only, and is not meant to be a limitation of the present invention. According to a variation of this embodiment, the shaping code generator 114G can directly utilize at least a portion of the side information $I_{SIDE}$ (or the appended information $I_A$) as the control signal $C_1$, and it is unnecessary to install the control unit 114C mentioned above in this variation. According to another variation of this embodiment, the control unit 114C mentioned above is replaced with a selection unit arranged to select at least a portion of the side information $I_{SIDE}$ (or the appended information $I_A$) as the control signal $C_1$.

Please note that the shaping code generator 114G of this embodiment can be applied to the data recovery module of the embodiments shown in FIGS. 1A-1C or any variation thereof.

Figure 1E:
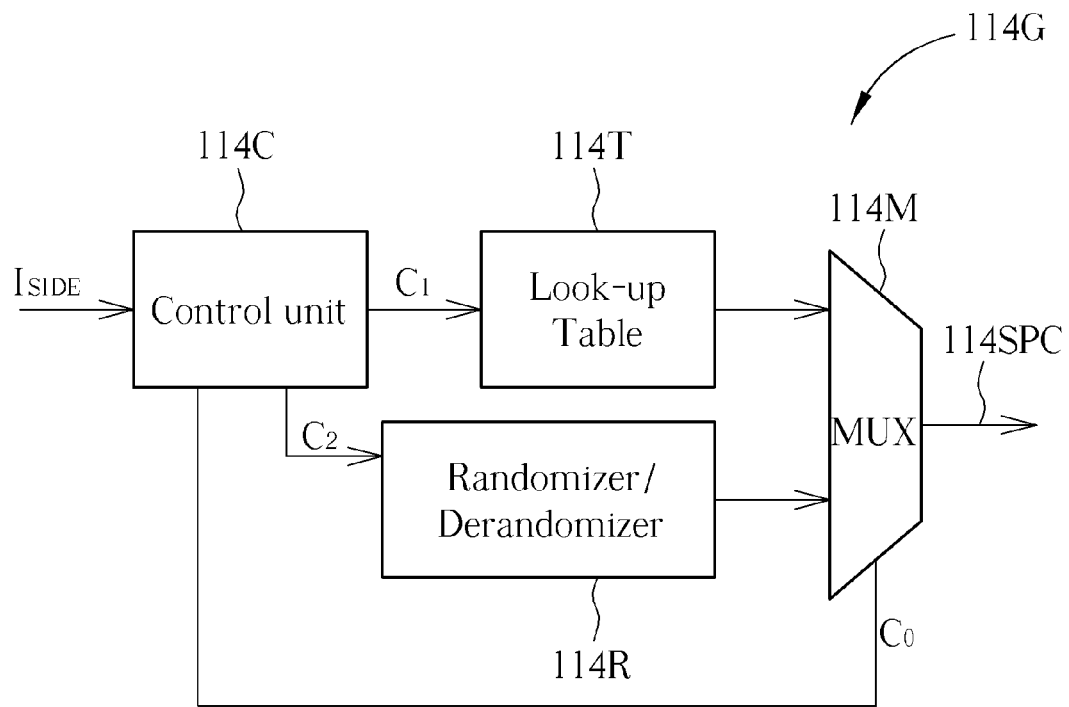

FIG. 1E illustrates some implementation details of the shaping code generator 114G shown in FIG. 1A according to another embodiment of the present invention, where this embodiment is a variation of the embodiment shown in FIG. 1D. In addition to the control unit 114C and the look-up table 114T mentioned above, the shaping code generator 114G of this embodiment further comprises a randomizer/derandomizer 114R and a multiplexer 114M (labeled "MUX" in FIG. 1E), where the look-up table 114T stores a portion of the plurality of shaping codes, and the randomizer/derandomizer 114R can generate any shaping code of the other portion of the plurality of shaping codes.

In this embodiment, according to the side information $I_{SIDE}$, the control unit 114C can generate a corresponding control signal $C_0$, and by utilizing the control signal $C_0$, the control unit 114C can select the output of the look-up table 114T or the output of the randomizer/derandomizer 114R as the output of the shaping code generator 114G. For example, in a situation where the control unit 114C selects the output of the look-up table 114T as the output of the shaping code generator 114G by utilizing the control signal $C_0$, the control unit 114C can generate the corresponding control signal $C_1$ according to the side information $I_{SIDE}$, and perform table look-up by utilizing the look-up table 114T in order to generate at least a portion of the one or more shaping codes 114SPC. In another example, in a situation where the control unit 114C selects the output of the randomizer/derandomizer 114R as the output of the shaping code generator 114G by utilizing the control signal $C_0$, the control unit 114C can generate the corresponding control signal $C_2$ according to the side information $I_{SIDE}$, and utilize the control signal $C_2$ as an input seed of the randomizer/derandomizer 114R, in order to make the randomizer/derandomizer 114R generate at least one random function according to the input seed, where the randomizer/derandomizer 114R outputs a sequence of the random function (which can also be referred to as the random sequence) as at least a portion of the one or more shaping codes 114SPC. This is for illustrative purposes only, and is not meant to be a limitation of the present invention. According to some variations of this embodiment, the shaping code generator 114G can directly utilize at least a portion of the side information $I_{SIDE}$ (or the appended information $I_A$) as the control signals $C_0$, $C_1$, and/or $C_2$, and it is unnecessary to install the control unit 114C mentioned above in these variations. According to other variations of this embodiment, the control unit 114C mentioned above is replaced with a selection unit arranged to select at least a portion of the side information $I_{SIDE}$ (or the appended information $I_A$) as the control signals $C_0$, $C_1$, and/or $C_2$.

Please note that the shaping code generator 114G of this embodiment can be applied to the data recovery module of the embodiments shown in FIGS. 1A-1C or any variation thereof.

According to an embodiment of the present invention, such as a variation of the embodiment shown in FIG. 1D and a variation of the embodiment shown in FIG. 1E, the shaping code generator 114G comprises the randomizer/derandomizer 114R, where it is unnecessary to install the look-up table 114T and the multiplexer 114M mentioned above in this embodiment, and it is unnecessary to generate the control signals $C_0$ and $C_1$. In this embodiment, the randomizer/derandomizer 114R can generate any shaping code of the plurality of shaping codes, and the randomizer/derandomizer 114R outputs the sequence of the random function (i.e. the random sequence) as the one or more shaping codes 114SPC. This is for illustrative purposes only, and is not meant to be a limitation of the present invention. According to a variation of this embodiment, the shaping code generator 114G can directly utilize at least a portion of the side information $I_{SIDE}$ (or the appended information $I_A$) as the control signal $C_2$, and it is unnecessary to install the control unit 114C mentioned above in this variation. According to another variation of this embodiment, the control unit 114C mentioned above is replaced with a selection unit arranged to select at least a portion of the side information $I_{SIDE}$ (or the appended information $I_A$) as the control signal $C_2$.

Based upon the architecture of any of the embodiments/variations disclosed above, the present invention can provide Multiple Level Cell (MLC) Flash memories, and more particularly, Triple Level Cell (TLC) Flash memories, with extremely high performance. Please refer to FIG. 2 for related details of data shaping performed by the memory controller 110.

Figure 2:
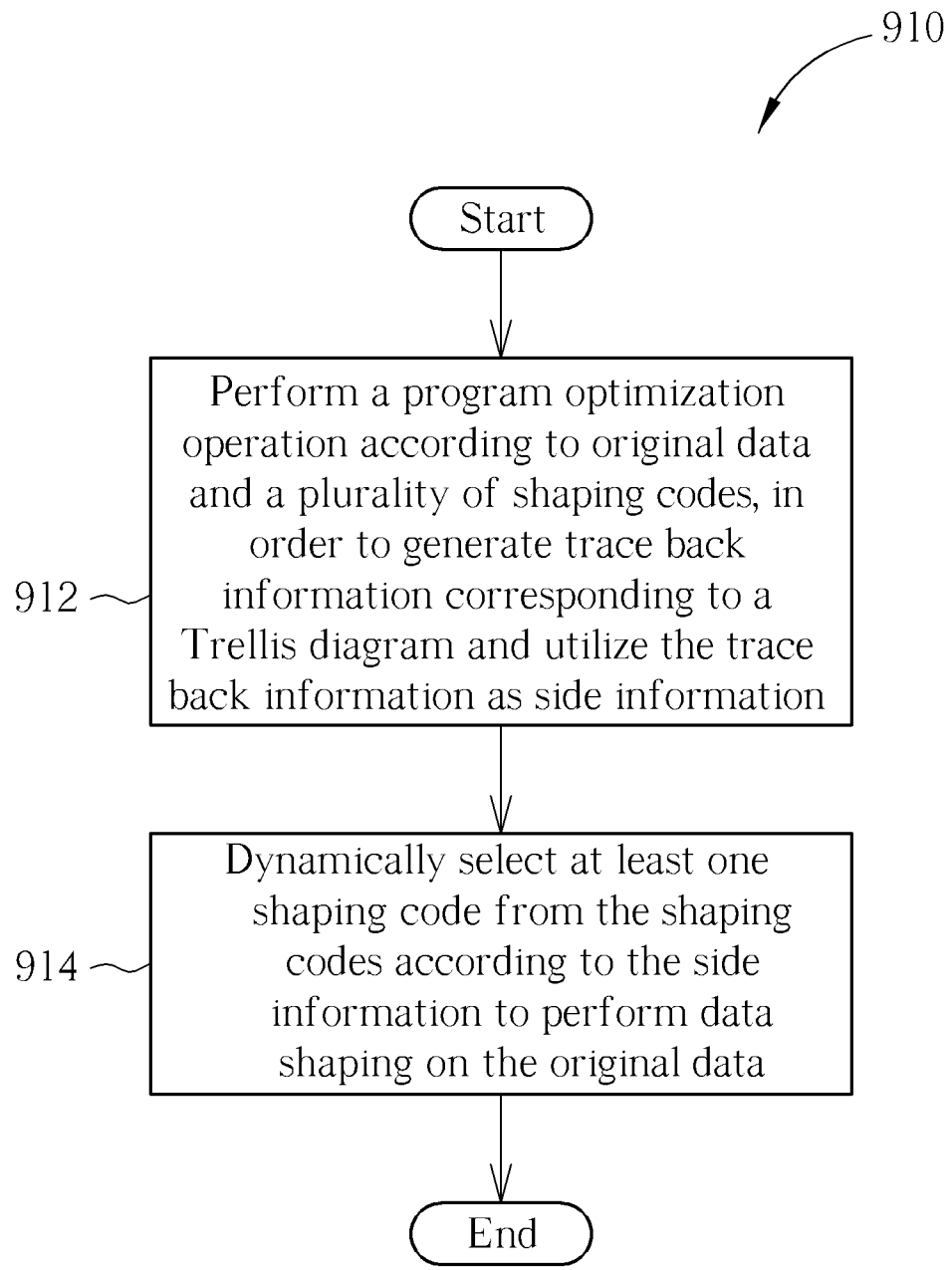
FIG. 2 is a flowchart of a method for performing data shaping according to an embodiment of the present invention.

FIG. 2 is a flowchart of a method 910 for performing data shaping according to an embodiment of the present invention. The method can be applied to the memory device 100 shown in FIG. 1A, and more particularly, to the controller mentioned above (e.g. the memory controller 110 that executes the program code 112C by utilizing the microprocessor 112). In addition, the method can be implemented by utilizing the memory device 100 shown in FIG. 1A, and more particularly, by utilizing the controller mentioned above. The method 910 is described as follows.

In Step 912, the controller (and more particularly, the pre-processor 114P therein in this embodiment) performs a program optimization operation such as the aforementioned program optimization operation according to original data (e.g. the data D1) and a plurality of shaping codes, in order to generate trace back information corresponding to a Trellis diagram and utilize the trace back information as the side information $I_{SIDE}$. Please note that, according to a variation of this embodiment, such as the variation in which the program optimization operation can be implemented by utilizing the program module in the program code 112C, the pre-processor 114P can be replaced with the memory controller 110 that executes the program module by utilizing the microprocessor 112.

In Step 914, the aforementioned at least one data shaping module/data recovery module (e.g. the data shaping module 114DS) dynamically selects at least one shaping code from the shaping codes, such as the aforementioned one or more shaping codes 114SPC, according to the side information $I_{SIDE}$ to perform data shaping on the original data. For example, the operation of data shaping mentioned above can be implemented by performing an exclusive OR (XOR) operation on the aforementioned at least one shaping code and at least one portion of the original data, and more particularly, by performing the XOR operation on corresponding bits of both the aforementioned at least one shaping code and the aforementioned at least one portion of the original data, where such an XOR operation can be referred to as the bitwise XOR operation.

According to this embodiment, the Trellis diagram comprises a plurality of stages 360-1, 360-2, . . . , 360-(K−1), and 360-K. Each stage of the respective stages of the Trellis diagram, such as the $k^{th}$ stage 360-$k$ ($k=1, 2, . . . , (K−1)$, or K, with K being a positive integer), comprises a plurality of sub-paths $\{P_{X1(k),X2(k)}\}$, where the sub-paths can also be referred as the paths regarding the stage under consideration. For example, X1(k) and X2(k) can be arbitrarily selected from some integers of the same integer set, and more particularly, can be non-negative integers. Here, a sub-path $P_{X1(k),X2(k)}$ is the path of state transition from a beginning state $S_{X1(k)}$ to a resultant state $S_{X2(k)}$ within the $k^{th}$ stage 360-$k$, where if the next stage (i.e. the $(k+1)^{th}$ stage 360-$(k+1)$) exists, the resultant state $S_{X2(k)}$ is a beginning state of the next stage. For simplicity, the beginning state $S_{X1(k)}$ and the resultant state $S_{X2(k)}$ mentioned above can be written as the states $S_X(k)$ and $S_X(k+1)$, respectively. For example, in a situation where the Trellis diagram is a four-state Trellis diagram, X=0, 1, 2, or 3. In another example, in a situation where the Trellis diagram is an eight-state Trellis diagram, X=0, 1, . . . , or 7. This is for illustrative purposes only, and is not meant to be a limitation of the present invention. According to some variations of this embodiment, the number of possible values of the state index X can be any positive integer other than four and eight, and the typical value of the number of possible values of the state index X is greater than one. According to other variations of this embodiment, it is unnecessary that the state index X is an integer.

In addition, the sub-paths of each stage represent the shaping codes, respectively. For example, in each stage such as the $k^{th}$ stage 360-$k$, a certain sub-path $P_{X1(k),X2(k)}$ within the sub-paths $\{P_{X1(k),X2(k)}\}$ represents a shaping code $SPC_{X1(k),X2(k)}$ within the shaping codes. More particularly, in a situation where associated shaping codes for each stage are the same set of shaping codes such as the shaping codes mentioned in Step 912, the shaping code $SPC_{X1(k),X2(k)}$ can be written as $SPC_{X1,X2}$, and therefore, no matter the index k is equal to any of the values 1, 2, . . . , (K−1), and K, the sub-path $P_{X1(k),X2(k)}$ always represents the same shaping code $SPC_{X1,X2}$ within the shaping codes. That is, in this situation, the shaping code $SPC_{X1,X2}$ is independent of the index k of the $k^{th}$ stage 360-$k$. Thus, within the respective stages of the Trellis diagram, both a sub-path corresponding to specific state transition in any stage and a sub-path corresponding to the same state transition in another stage represent the same shaping code of the shaping codes.

In this embodiment, the controller finds an optimal path within the Trellis diagram, and generates sub-path trace back information of the respective sub-paths (e.g. the sub-paths $\{P_{X1(k),X2(k)}\}$) within the optimal path with respect to the respective stages (e.g. the $k^{th}$ stage 360-$k$) and utilizes the sub-path trace back information as at least a portion of the side information $I_{SIDE}$, where the destination of the optimal path is an optimal state within the respective resultant states $S_X(K+1)$ (e.g. X=0, 1, 2, . . . , etc.) of the last stage 360-K of the Trellis diagram, such as the optimal state $S_{X0}(K+1)$, and the side information $I_{SIDE}$ comprises destination information representing the optimal state $S_{X0}(K+1)$, such as the binary value of X0. More particularly, with regard to the respective stages of the Trellis diagram, the controller performs adding, comparing, and selecting (ACS) operations corresponding to the Viterbi algorithm, in order to generate trace back indicators of the respective resultant states of at least one stage of the stages (e.g. all of the stages) and find the optimal state $S_{X0}(K+1)$ within the resultant states $S_X(K+1)$ of the last stage 360-K of the Trellis diagram, where the sub-path trace back information within the side information $I_{SIDE}$ comprises at least a portion of the trace back indicators. For example, for the respective stages of the Trellis diagram, such as the $k^{th}$ stage 360-$k$ with k varying from 1 to K, the controller can generate the trace back indicators $TBI_X(k)$ of the respective resultant states $S_X(k+1)$ of the $k^{th}$ stage 360-$k$. Thus, the controller can find the optimal path according to the destination information (e.g. the binary value of X0) and the sub-path trace back information (e.g. at least a portion of the trace back indicators $TBI_X(k)$), and determine the shaping code represented by the sub-path of the optimal path with respect to any stage such as the $k0^{th}$ stage according to how the optimal path passes through the $k0^{th}$ stage, in order to perform data shaping on the portion corresponding to the $k0^{th}$ stage within the original data. For example, in a situation where the sub-path of the optimal path with respect to the $k0^{th}$ stage is the sub-path $P_{X1(k0),X2(k0)}$, as the candidate shaping code represented by the sub-path $P_{X1(k0),X2(k0)}$ is the shaping code $SPC_{X1,X2}$, the controller utilizes the shaping code $SPC_{X1,X2}$ to perform data shaping on the portion corresponding to the $k0^{th}$ stage within the original data.

Figure 3A:
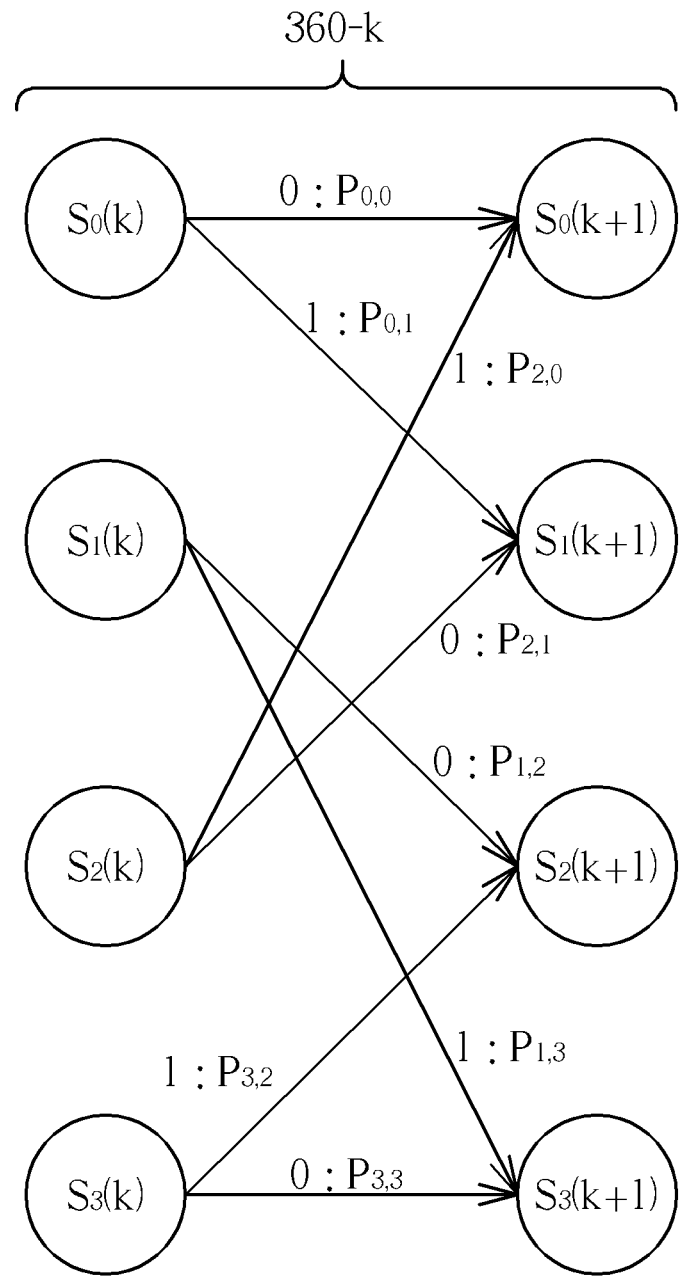
Figure 3B:
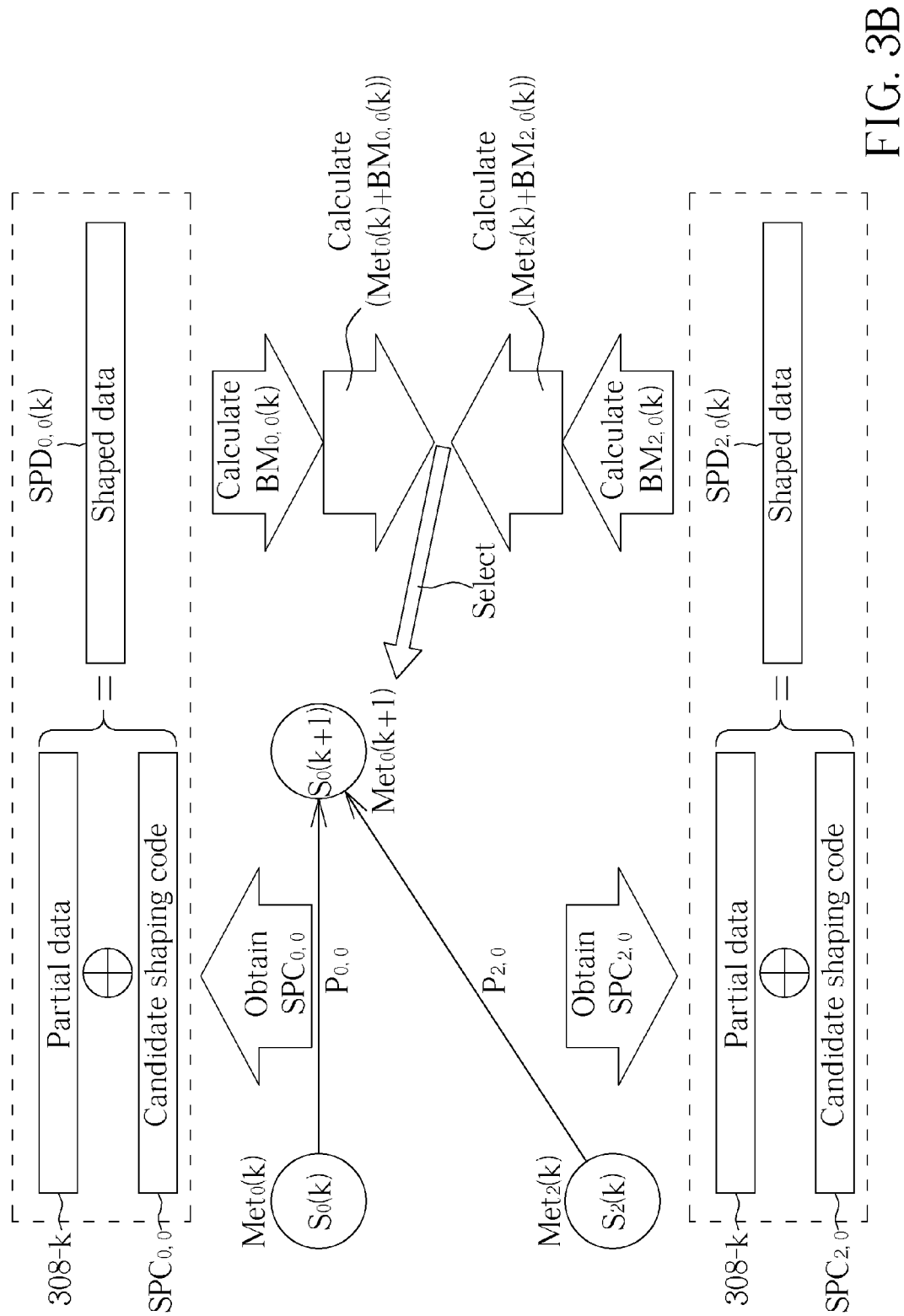

FIGS. 3A-3C illustrate some implementation details of the program optimization operation involved with the method 910 shown in FIG. 2 according to an embodiment of the present invention, where FIG. 3C further illustrates some shaping codes 310 utilized by the data shaping module 114DS shown in FIG. 1A during data shaping, such as the shaping codes 310-1, 310-2, . . . , 310-(K−1), and 310-K, and each shaping code 310-$k$ ($k=1, 2, . . . , (K−1)$, or K) is selected from the shaping codes mentioned in Step 912. Please note that the original data mentioned in Step 912, such as the original data 308 shown in FIG. 3C, comprises partial data 308-1, 308-2, . . . , and 308-K respectively corresponding to the respective stages 360-1, 360-2, . . . , and 360-K of the Trellis diagram, i.e. the portions respectively corresponding to the $1^{st}$ stage 360-1, the $2^{nd}$ stage 360-2, . . . , and the $k^{th}$ stage 360-$k$ within the original data 308.

As shown in FIG. 3A, each stage of the respective stages of the Trellis diagram, such as the $k^{th}$ stage 360-$k$, comprises eight sub-paths $\{P_{0,0}, P_{0,1}, P_{1,2}, P_{1,3}, P_{2,0}, P_{2,1}, P_{3,2}, P_{3,3}\}$, and the eight sub-paths are the paths of state transition from the states $\{S_0(k), S_1(k), S_2(k), S_3(k)\}$ to the states $\{S_0(k+1), S_1(k+1), S_2(k+1), S_3(k+1)\}$ within the $k^{th}$ stage 360-$k$, respectively. In addition, the eight sub-paths $\{P_{0,0}, P_{0,1}, P_{1,2}, P_{1,3}, P_{2,0}, P_{2,1}, P_{3,2}, P_{3,3}\}$ represents eight shaping codes $\{SPC_{0,0}, SPC_{0,1}, SPC_{1,2}, SPC_{1,3}, SPC_{2,0}, SPC_{2,1}, SPC_{3,2}, SPC_{3,3}\}$, respectively. In this embodiment, the sub-paths that respectively point from the state $S_0(k)$ to the states $S_0(k+1)$ and $S_1(k+1)$ can be recorded as 0 and 1, respectively. Similarly, the sub-paths that respectively point from the state $S_1(k)$ to the states $S_2(k+1)$ and $S_3(k+1)$ can be recorded as 0 and 1, respectively. In addition, the sub-paths that respectively point from the state $S_3(k)$ to the states $S_3(k+1)$ and $S_2(k+1)$ can be recorded as 0 and 1, respectively. Similarly, the sub-paths that respectively point from the state $S_2(k)$ to the states $S_1(k+1)$ and $S_0(k+1)$ can be recorded as 0 and 1, respectively.

As shown in FIG. 3B, during finding the optimal path such as the optimal path 390 shown in FIG. 3C, for each state such as the $k^{th}$ stage 360-$k$, the controller calculates the metrics $Met_X(k+1)$ of the respective resultant states $S_X(k+1)$ of the $k^{th}$ stage 360-$k$, where the controller can set the metrics $Met_X(1)$ of the respective beginning states $S_X(1)$ of the $1^{st}$ stage 360-1 as the same value, and more particularly, zero. In this embodiment, with regard to the partial data 308-$k$ corresponding to the $k^{th}$ stage 360-$k$, the controller calculates at least two branch metrics respectively corresponding to at least two shaping codes (e.g. the branch metrics $BM_{0,0}(k)$ and $BM_{2,0}(k)$ respectively corresponding to the shaping codes $SPC_{0,0}$ and $SPC_{2,0}$). With regard to the partial data 308-1, 308-2, ..., and 308-K respectively corresponding to the stages 360-1, 360-2, ..., and 360-K, by performing similar calculations, the controller can accumulate at least a portion of a plurality of branch metrics of the stages to perform the program optimization operation.

For example, in a situation where the metric $Met_0(k)$ of the beginning state $S_0(k)$ and the metric $Met_2(k)$ of the beginning state $S_2(k)$ of the $k^{th}$ stage 360-$k$ have been obtained, the controller can obtain the shaping codes $SPC_{0,0}$ and $SPC_{2,0}$ respectively represented by the sub-paths $P_{0,0}$ and $P_{2,0}$ first, and then calculate the branch metrics $BM_{0,0}(k)$ and $BM_{2,0}(k)$ respectively corresponding to the two shaping codes $SPC_{0,0}$ and $SPC_{2,0}$ (or the branch metrics $BM_{0,0}(k)$ and $BM_{2,0}(k)$ respectively corresponding to the two sub-paths $P_{0,0}$ and $P_{2,0}$) according to the shaping codes $SPC_{0,0}$ and $SPC_{2,0}$, and calculate the accumulation values $(Met_0(k)+BM_{0,0}(k))$ and $(Met_2(k)+BM_{2,0}(k))$ respectively corresponding to the two sub-paths $P_{0,0}$ and $P_{2,0}$. More particularly, the controller can perform a bitwise XOR operation (labeled "⊕" around the upper left corner in FIG. 3B) on the partial data 308-$k$ and the shaping code $SPC_{0,0}$ to generate the shaped data $SPD_{0,0}(k)$, and calculate the branch metric $BM_{0,0}(k)$ accordingly. Similarly, the controller can perform a bitwise XOR operation (labeled "⊕" around the bottom left corner in FIG. 3B) on the partial data 308-$k$ and the shaping code $SPC_{2,0}$ to generate the shaped data $SPD_{2,0}(k)$, and calculate the branch metric $BM_{2,0}(k)$ accordingly. In practice, the previous data information $I_{PD}$ may carry at least a portion of the previous data or the representative information thereof, so the controller can calculate the branch metric $BM_{0,0}(k)$ by comparing $SPD_{0,0}(k)$ and the associated portion of the previous data information $I_{PD}$, and calculate the branch metric $BM_{2,0}(k)$ by comparing $SPD_{2,0}(k)$ and the associated portion of the previous data information $I_{PD}$.

In this embodiment, the controller can select a certain accumulation value of the accumulation values $(Met_0(k)+BM_{0,0}(k))$ and $(Met_0(k)+BM_{2,0}(k))$ as the metric $Met_0(k+1)$ of the resultant state $S_0(k+1)$ according to at least one predetermined rule, and generate the trace back indicator $TBI_0(k)$ of the resultant state $S_0(k+1)$ and temporarily store the trace back indicator $TBI_0(k)$, where the value of the trace back indicator $TBI_0(k)$ indicates the sub-path corresponding to the accumulation value selected by the controller. For example, in a situation where the predetermined rule indicates that the controller should select the maximum accumulation value, the controller can select the maximum accumulation value of the two accumulation values $(Met_0(k)+BM_{0,0}(k))$ and $(Met_2(k)+BM_{2,0}(k))$ as the metric $Met_0(k+1)$ of the resultant state $S_0(k+1)$. This is for illustrative purposes only, and is not meant to be a limitation of the present invention. According to a variation of this embodiment, in a situation where the predetermined rule indicates that the controller should select the minimum accumulation value, the controller can select the minimum accumulation value of the two accumulation values $(Met_0(k)+BM_{0,0}(k))$ and $(Met_2(k)+BM_{2,0}(k))$ as the metric $Met_0(k+1)$ of the resultant state $S_0(k+1)$. According to another variation of this embodiment, the aforementioned at least one predetermined rule comprises a plurality of predetermined rules.

In practice, once the controller selects a certain accumulation value of the two accumulation values $(Met_0(k)+BM_{0,0}(k))$ and $(Met_2(k)+BM_{2,0}(k))$, the controller discards the other accumulation value to reduce the working load of the controller. This is for illustrative purposes only, and is not meant to be a limitation of the present invention. According to a variation of this embodiment, in a situation where the accumulation values for being selected comprise at least three accumulation values, once the controller selects a certain accumulation value of the aforementioned at least three accumulation values, the controller discards the other accumulation values to reduce the working load of the controller.

According to this embodiment, the controller can select the optimal state $S_{X0}(K+1)$ from the respective resultant states $S_X(K+1)$ of the last stage 360-K according to the aforementioned at least one predetermined rule or other predetermined rule(s), and more particularly, can select the optimal state $S_{X0}(K+1)$ by comparing the metrics $Met_X(K+1)$ of the respective resultant states $S_X(K+1)$ of the last stage, such as the metrics $Met_0(K+1), Met_1(K+1), Met_2(K+1)$, and $Met_3(K+1)$. As a result, according to at least a portion of the trace back indicators $TBI_X(k)$, starting from the optimal state $S_{X0}(K+1)$, the controller can find out the respective sub-paths of the optimal path such as the optimal path 390 shown in FIG. 3C one by one. For example, the pre-processor 114P can record the trace back indicators $TBI_X(k)$ according to the simplified sub-path notations shown in FIG. 3A. In this situation, the pre-processor 114P can record the sub-path trace back information as 10 ... 01, and can collectively record the destination information X0 such as the binary value 00 and the sub-path trace back information 10 ... 01 as the side information $I_{SIDE}$, i.e. 10 ... 0100. This is for illustrative purposes only, and is not meant to be a limitation of the present invention. According to a variation of this embodiment, the simplified sub-path notations shown in FIG. 3A can be varied. For example, the upper sub-path and the lower sub-path within the two sub-paths that respectively point to the same state $S_X(k+1)$ can be respectively labeled as 0 and 1 (which can be regarded as the simplified sub-path notations), and the pre-processor 114P can record the trace back indicators $TBI_X(k)$ according to the simplified sub-path notations. Thus, in a situation where one or more of the trace back indicators $TBI_X(k)$ are equal to 1, the one or more of the trace back indicators $TBI_X(k)$ indicate that, in the $k^{th}$ stage 360-$k$, the optimal path 390 can be traced back from the state $S_X(k+1)$ to the lower sub-path. On the contrary, in a situation where one or more of the trace back indicators $TBI_X(k)$ are equal to 0, the one or more of the trace back indicators $TBI_X(k)$ indicate that, in the $k^{th}$ stage 360-$k$, the optimal path 390 can be traced back from the state $S_X(k+1)$ to the upper sub-path.

Taking the situation shown in FIG. 3C as an example, in a situation where the optimal state mentioned above (e.g. the destination of the optimal path 390) is the state $S_0(K+1)$, the controller finds out the sub-path $P_{2,0}$ (K) of the optimal path 390 with respect to the $K^{th}$ stage according to the trace back indicator $TBI_0$ (K), and then finds out the sub-path $P_{1,2}$ (K−1) of the optimal path 390 with respect to the $(K-1)^{th}$ stage according to the trace back indicator $TBI_2(K-1)$, and the rest may be deduced by analogy. Similarly, the controller finds out the sub-path $P_{1,2}$ (2) of the optimal path 390 with respect to the $2^{nd}$ stage according to the trace back indicator $TBI_2(2)$, and then finds out the sub-path $P_{0,1}(1)$ of the optimal path 390 with respect to the $1^{st}$ stage according to the trace back indicator $TBI_1(1)$. As a result, the controller (and more particularly, the pre-processor 114P therein in this embodiment) sends the sub-path trace back information of the respective sub-paths $P_{0,1}(1)$, $P_{1,2}(2)$, ..., $P_{1,2}(K-1)$, and $P_{2,0}(K)$ of the optimal path 390 with respect to the respective stages (such as the $1^{st}$ stage 360-1, the $2^{nd}$ stage 360-2, ..., the $(K-1)^{th}$ stage 360-(K−1), and the $k^{th}$ stage 360-$k$) of Trellis diagram to the aforementioned data shaping module/data recovery module. Thus, the side information $I_{SIDE}$ comprises the sub-path trace back information of the respective sub-paths of the optimal path 390 with respect to the respective stages of Trellis diagram, i.e. the sub-path trace back information of the sub-paths $P_{0,1}(1)$, $P_{1,2}(2)$, ..., $P_{1,2}(K-1)$, and $P_{2,0}(K)$.

As a result, with regard to specific partial data corresponding to a specific stage (e.g. the partial data 308-$k$ corresponding to the $k^{th}$ stage 360-$k$), the aforementioned data shaping module/data recovery module (e.g. the data shaping module 114DS) selects a specific shaping code from the shaping codes according to at least a portion of the side information $I_{SIDE}$, in order to perform data shaping corresponding to the specific partial data. Taking the situation shown in FIG. 3C as an example, the aforementioned data shaping module/data recovery module respectively selects the shaping codes $SPC_{0,1}$, $SPC_{1,2}$, ..., $SPC_{1,2}$, and $SPC_{2,0}$ as the shaping codes 310-1, 310-2, ..., 310-(K−1), and 310-K shown in FIG. 3C according to the sub-path trace back information of the respective sub-paths $P_{0,1}(1)$, $P_{1,2}(2)$, ..., $P_{1,2}$ (K−1), and $P_{2,0}$ (K) within the side information $I_{SIDE}$, in order to perform data shaping respectively corresponding to the partial data 308-1, 308-2, ..., 308-(K−1), and 308-K.

Please note that, with regard to each stage such as the $k^{th}$ stage 360-$k$, in a situation where the accumulation values for being selected include only two accumulation values, the trace back indicators $TBI_X(k)$ can be the information of one bit. As there are K stages in the Trellis diagram, the sub-path trace back information within the side information $I_{SIDE}$ may include only K bits. In addition, in a situation where the number of possible values of the state index X is equal to four, the destination information within the side information $I_{SIDE}$, such as the binary value of X0, may include only 2 bits. Thus, in this embodiment, the side information $I_{SIDE}$ may include only (K+2) bits, so the storage space required for storing the appended information $I_A$ in the Flash memory 120 is minor according to the present invention. Therefore, in contrast to any architecture of the related art, the present invention can provide extreme high performance, having no need to extravagantly waste the storage space.

FIGS. 4A-4E illustrate some implementation details of the program optimization operation involved with the method 910 shown in FIG. 2 according to another embodiment of the present invention. Please refer to FIG. 4A, which illustrates the relationships between the original data 400 and the partial data 400-1, 400-2, 400-3, and 400-4 thereof. In this embodiment, the host device is going to program/write the original data 400 having the data length of one memory page into the Flash memory 120, where the original data 400 is divided into four portions, such as the partial data 400-1 through to the partial data 400-4.

Figure 4A:
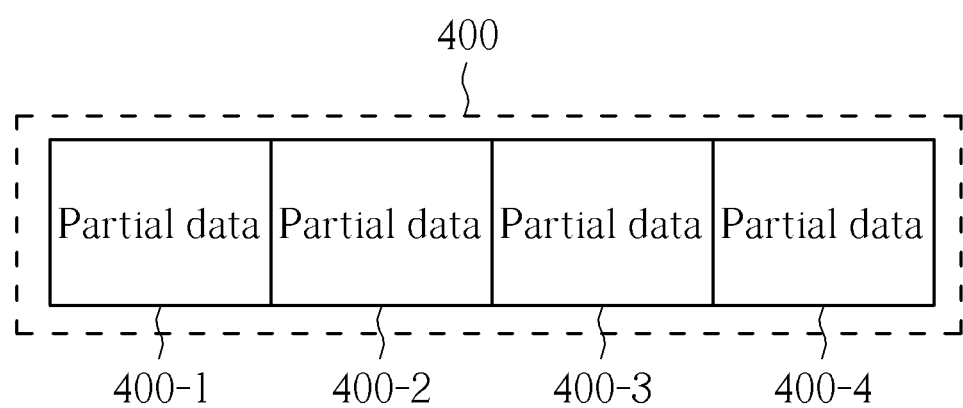
FIGS. 4A-4E illustrate some implementation details of the program optimization operation involved with the method shown in FIG. 2 according to another embodiment of the present invention.
Figure 4B:
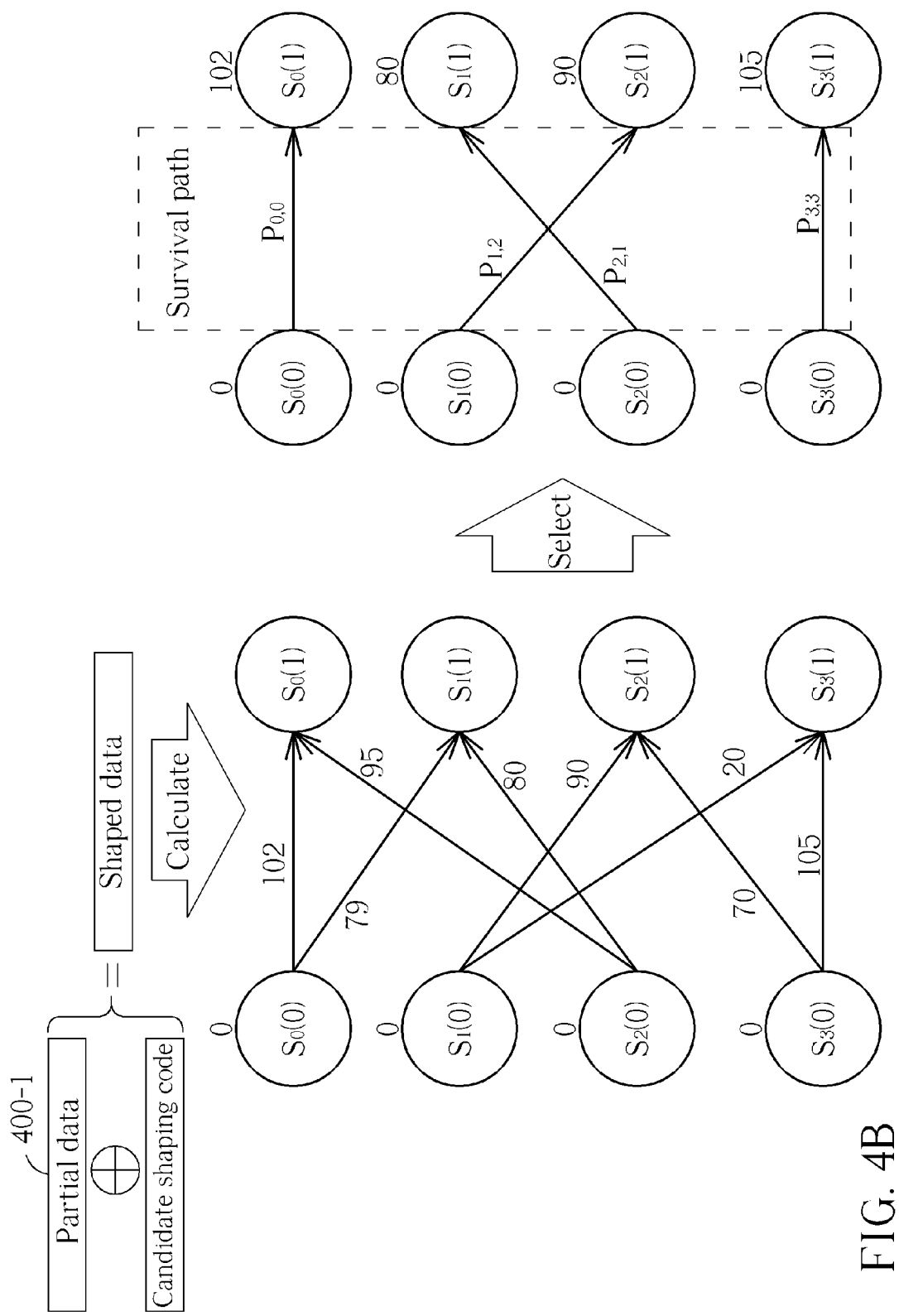

First, referring to FIG. 4B, the pre-processor 114P performs processing regarding the partial data 400-1. According the method illustrated in FIG. 3B, the pre-processor 114P performs data shaping on the partial data 400-1 and performs associated calculations and selection. The pre-processor 114P performs a bitwise XOR operation on the partial data 400-1 and each of eight different candidate shaping codes, in order to generate eight different sets of shaped data, respectively. The eight different candidate shaping codes respectively correspond to the sub-paths $P_{0,0}/P_{0,1}/P_{1,2}/P_{1,3}/P_{2,0}/P_{2,1}/P_{3,2}$, and $P_{3,3}$ shown in FIG. 3A. The pre-processor 114P performs the associated calculations on the eight different sets of shaped data, respectively. In an embodiment, the pre-processor 114P can compare any set of shaped data within the sets of shaped data with the corresponding partial data in the previous page within the Flash memory 120 bit by bit. If it is detected that both any bit in the set of shaped data and a corresponding bit in the corresponding partial data in the previous page are equal to the same logical value, such as the logical value 0 or the logical value 1, the pre-processor 114P increases the branch metric corresponding to the set of shaped data with an increment of one; otherwise, the pre-processor 114P does not increase the branch metric corresponding to the set of shaped data. In this embodiment, the branch metrics that are respectively obtained for the respective sets of shaped data are labeled on the corresponding sub-paths shown in FIG. 4B, respectively. For example, the branch metric obtained for the set of shaped data that is generated by performing the bitwise XOR operation on the partial data 400-1 and the shaping code corresponding to the sub-path $P_{0,0}$ is equal to 102 (as illustrated with the number on the sub-path $P_{0,0}$ shown in FIG. 4B), i.e. $BM_{0,0}(0)=102$. In another example, the branch metric obtained for the set of shaped data that is generated by performing the bitwise XOR operation on the partial data 400-1 and the shaping code corresponding to the sub-path $P_{0,1}$ is equal to 79, i.e. $BM_{0,1}(0)=79$. The rest may be deduced by analogy.

Please note that, according to some variations of this embodiment, the pre-processor 114P can calculate the branch metrics regarding the eight different sets of shaped data without referring to the corresponding portion of data in the previous memory page. In practice, the pre-processor 114P may respectively calculate the number of bits of logical value 0 or the number of bits of logical value 1 in the respective sets of shaped data. For example, for the set of shaped data in which the difference between the number of bits of logical value 0 and the number of bits of logical value 1 is minimum among others of the eight sets of shaped data, the pre-processor 114P sets the associated branch metric to be maximum among others. In another example, for the set of shaped data in which the number of bits of logical value 1 is greater than others of the eight sets of shaped data, the pre-processor 114P sets the associated branch metric to be greater than others. In another example, for the set of shaped data in which the number of bits of logical value 0 is greater than others of the eight sets of shaped data, the pre-processor 114P sets the associated branch metric to be greater than others. According to other variations of this embodiment, the pre-processor 114P may utilize different branch metric calculation rules regarding the shaped data for the data stored in different memory pages, respectively. For example, regarding a memory page having a lower error rate, for the set of shaped data in which the number of bits of logical value 1 is greater than others of the eight sets of shaped data, the pre-processor 114P can set the associated branch metric to be greater than others. In another example, regarding a memory page having a higher error rate, for the set of shaped data in which the number of bits of logical value 0 is greater than others of the eight sets of shaped data, the pre-processor 114P can set the associated branch metric to be greater than others. In general, the pre-processor 114P may utilize different branch metric calculation rules regarding different Flash memory characteristics, respectively.

When performing selection, the pre-processor 114P compares the latest accumulation values of the respective paths pointing to the respective resultant states (and more particularly, the resultant states of the stage under consideration). As mentioned above, the metrics of the beginning states $S_0(0)$, $S_1(0)$, $S_2(0)$, and $S_3(0)$ are all preliminarily set as 0 (which are labeled above the circles of the states, respectively). For example, the sub-paths that respectively point to the resultant state $S_0(1)$ are the sub-paths $P_{0,0}$ and $P_{2,0}$. The accumulation value of the sub-path $P_{0,0}$ is equal to the branch metric $BM_{0,0}(0)$ plus the metric $Met_0(0)$ of the beginning state $S_0(0)$, i.e. (102+0)=102. The accumulation value of the sub-path $P_{2,0}$ is equal to the branch metric $BM_{2,0}(0)$ plus the metric $Met_2(0)$ of the beginning state $S_2(0)$, i.e. (95+0)=95. In this embodiment, the pre-processor 114P selects the sub-path having a greater accumulation value as the survival path. For example, the accumulation value of the sub-path $P_{0,0}$ (i.e. 102) is greater than the accumulation value of the sub-path $P_{2,0}$ (i.e. 95), so the pre-processor 114P selects the sub-path $P_{0,0}$ as the survival path, and records the metric $Met_0(1)$ of the resultant state $S_0(1)$ as 102 (which is labeled above the circle of the state $S_0(1)$, referring to the rightmost of FIG. 4B), and the rest may be deduced by analogy.

Figure 4C:
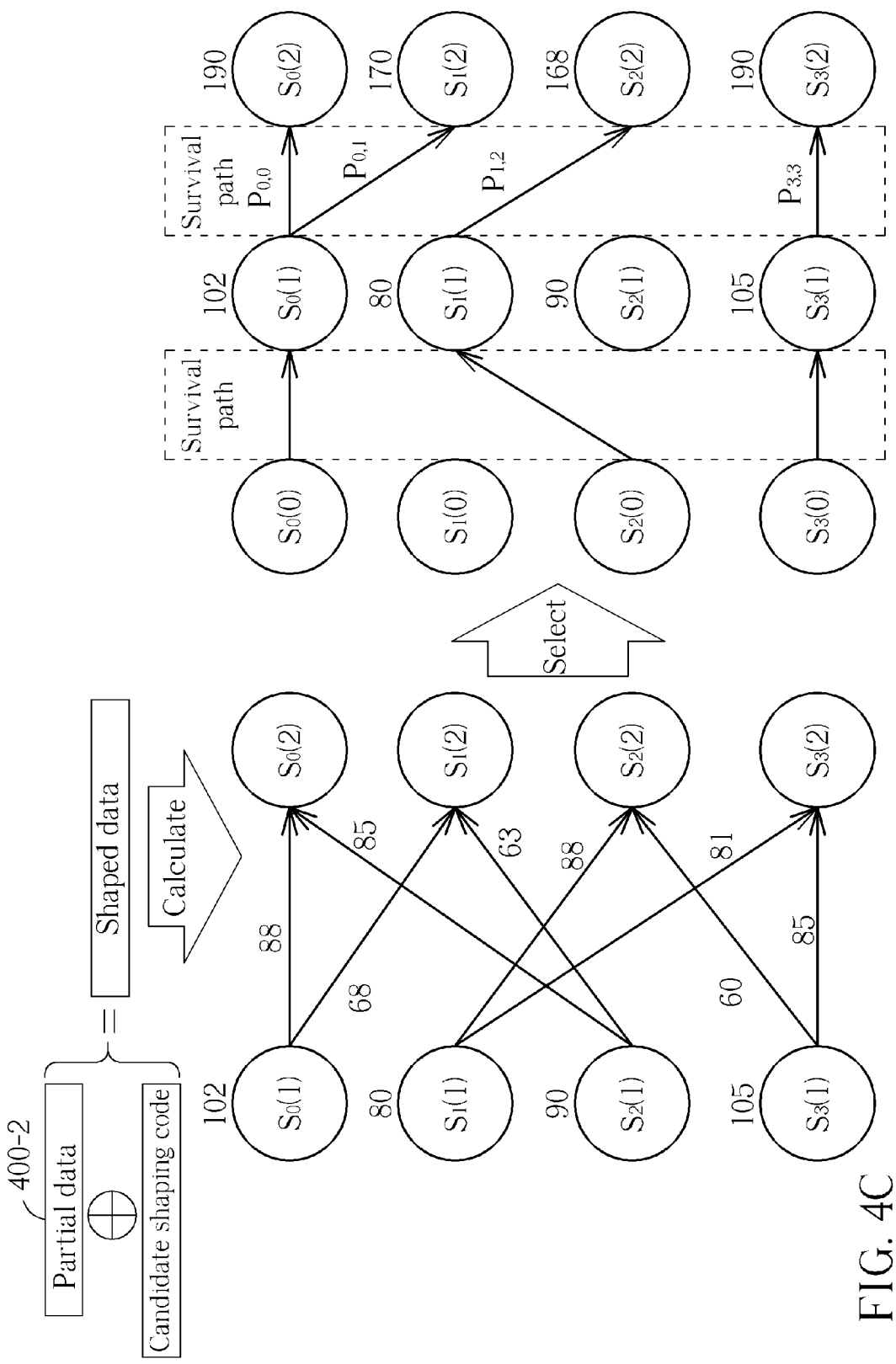

Afterward, referring to FIG. 4C, the pre-processor 114P performs data shaping on the partial data 400-2 and performs associated calculations and selection. The method that the pre-processor 114P performs data shaping on the partial data 400-2 and performs associated calculations and selection is similar to that shown in FIG. 4B. For brevity, similar descriptions are not repeated in detail. The metrics of the resultant states $S_0(1)$, $S_1(1)$, $S_2(1)$, and $S_3(1)$ and the respective branch metrics are illustrated in FIG. 4C. Please note that, in FIG. 4B, the metrics of the beginning states $S_0(0)$, $S_1(0)$, $S_2(0)$, and $S_3(0)$ are all preliminarily set as 0. In addition, in FIG. 4C, the metrics of the beginning states $S_0(1)$, $S_1(1)$, $S_2(1)$, and $S_3(1)$ (which can be referred to as the resultant states in FIG. 4B) are 102, 80, 90, and 105, respectively. When performing path selection, the pre-processor 114P should consider the metrics of the respective beginning states (e.g. the resultant states of the previous stage). For example, the sub-paths that respectively point to the resultant state $S_1(2)$ are the sub-paths $P_{0,1}$ and $P_{2,1}$. The accumulation value of the sub-path $P_{0,1}$ is equal to the branch metric $BM_{0,1}(1)$ plus the metric $Met_0(1)$ of the beginning state $S_0(1)$, i.e. (68+102)=170. The accumulation value of the sub-path $P_{2,1}$ is equal to the branch metric $BM_{2,1}(1)$ plus the metric $Met_2(1)$ of the beginning state $S_2(1)$, i.e. (63+90)=153. The pre-processor 114P selects the sub-path having a greater accumulation value as the survival path. The accumulation value of the sub-path $P_{0,1}$ (i.e. 170) is greater than the accumulation value of the sub-path $P_{2,1}$ (i.e. 153), so the pre-processor 114P selects the sub-path $P_{0,1}$ as the survival path, and records the metric $Met_1(2)$ of the resultant state $S_1(2)$ as 170, and the rest may be deduced by analogy.

Figure 4D:
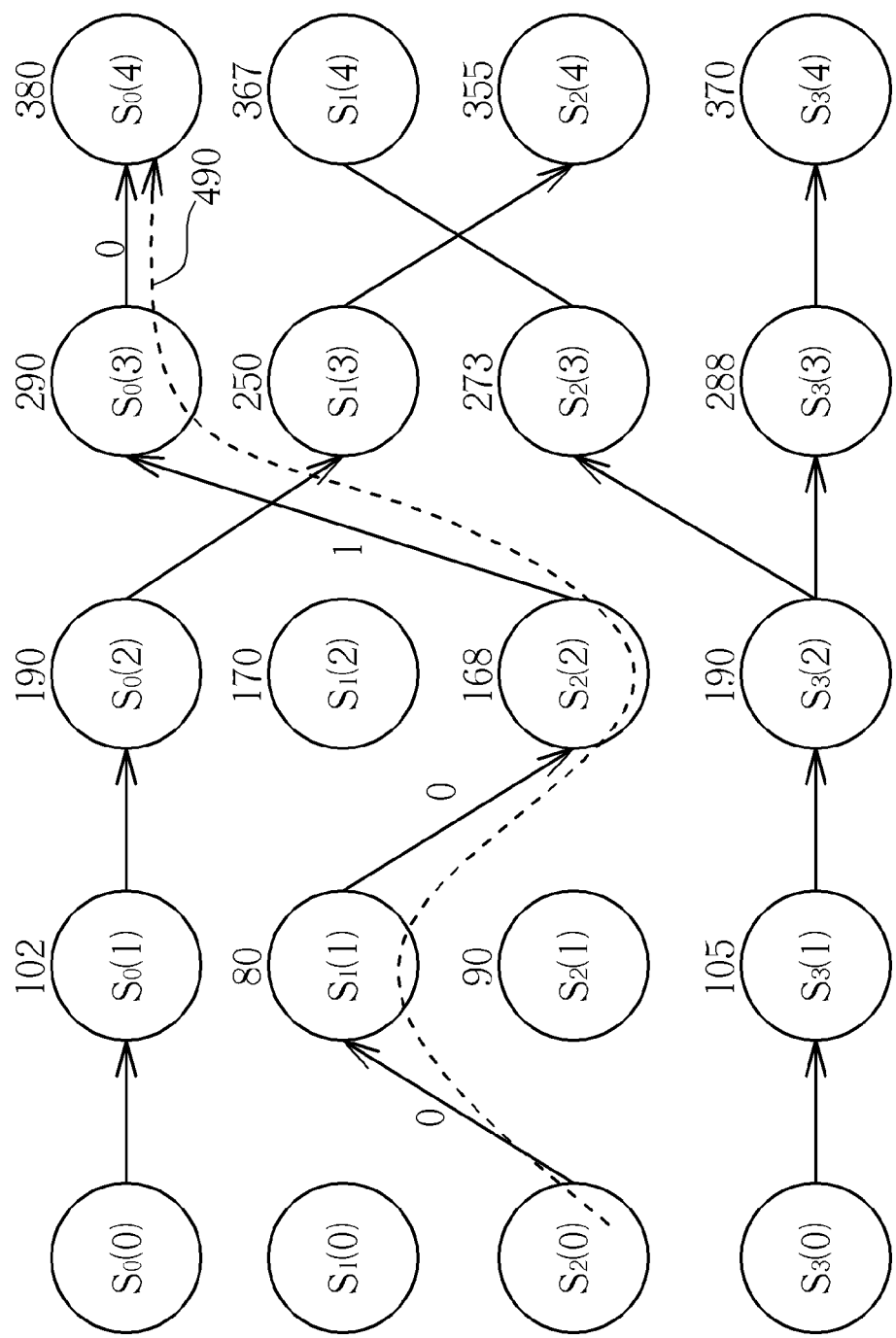
Figure 4E:
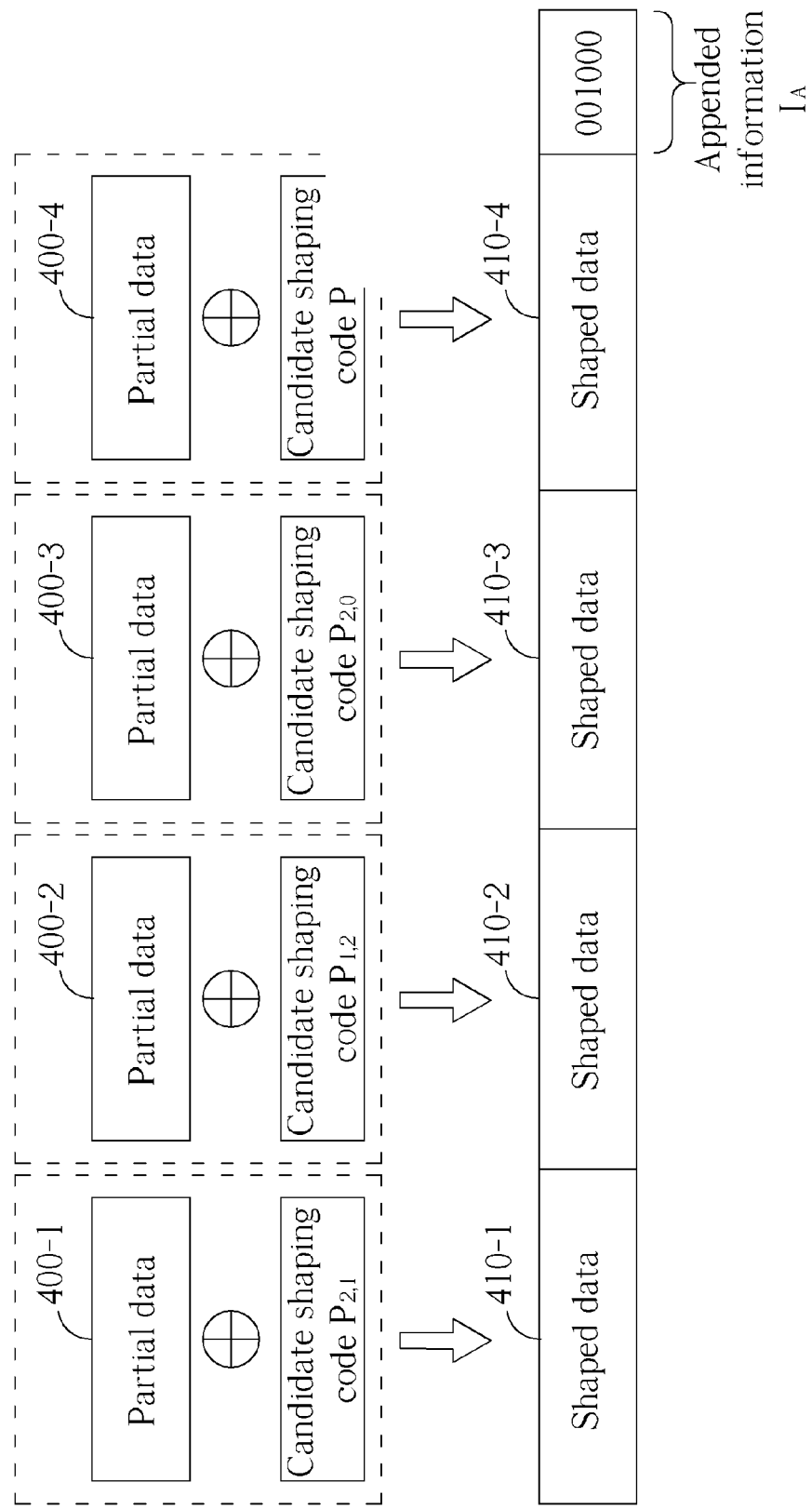

Please refer to FIG. 4D. After the pre-processor 114P completes performing data shaping on the partial data 400-1 through to the partial data 400-4 and performing associated calculations and selection, the pre-processor 114P can obtain the metrics of the resultant states $S_0(4)$, $S_1(4)$, $S_2(4)$, and $S_3(4)$, which are 380, 367, 355, and 370 in this embodiment, respectively. In this embodiment, the pre-processor 114P selects the resultant state $S_0(4)$ having the greatest metric as the optimal state, and according to the survival paths thereof (and more particularly, the sub-paths linked to the resultant state $S_0(4)$), the pre-processor 114P finds out the optimal path 490. When recording the side information $I_{SIDE}$, the pre-processor 114P can record the destination information as 00 according to the optimal state $S_0(4)$. When recording the sub-path trace back information, the pre-processor 114P can record the sub-path trace back information as 0010 according to the optimal path 490 and the simplified sub-path notations shown in FIG. 3A. Therefore, the pre-processor 114P can collectively record the destination information and the sub-path trace back information as the side information $I_{SIDE}$, i.e. 001000. FIG. 4E illustrates the data $D_{RND1}$ and the appended information $I_A$ that are generated by the data shaping module 114DS. In this embodiment, the appended information $I_A$ is the side information $I_{SIDE}$. This is for illustrative purposes only, and is not meant to be a limitation of the present invention. According to a variation of this embodiment, the appended information $I_A$ may comprise other information.

Figure 5:
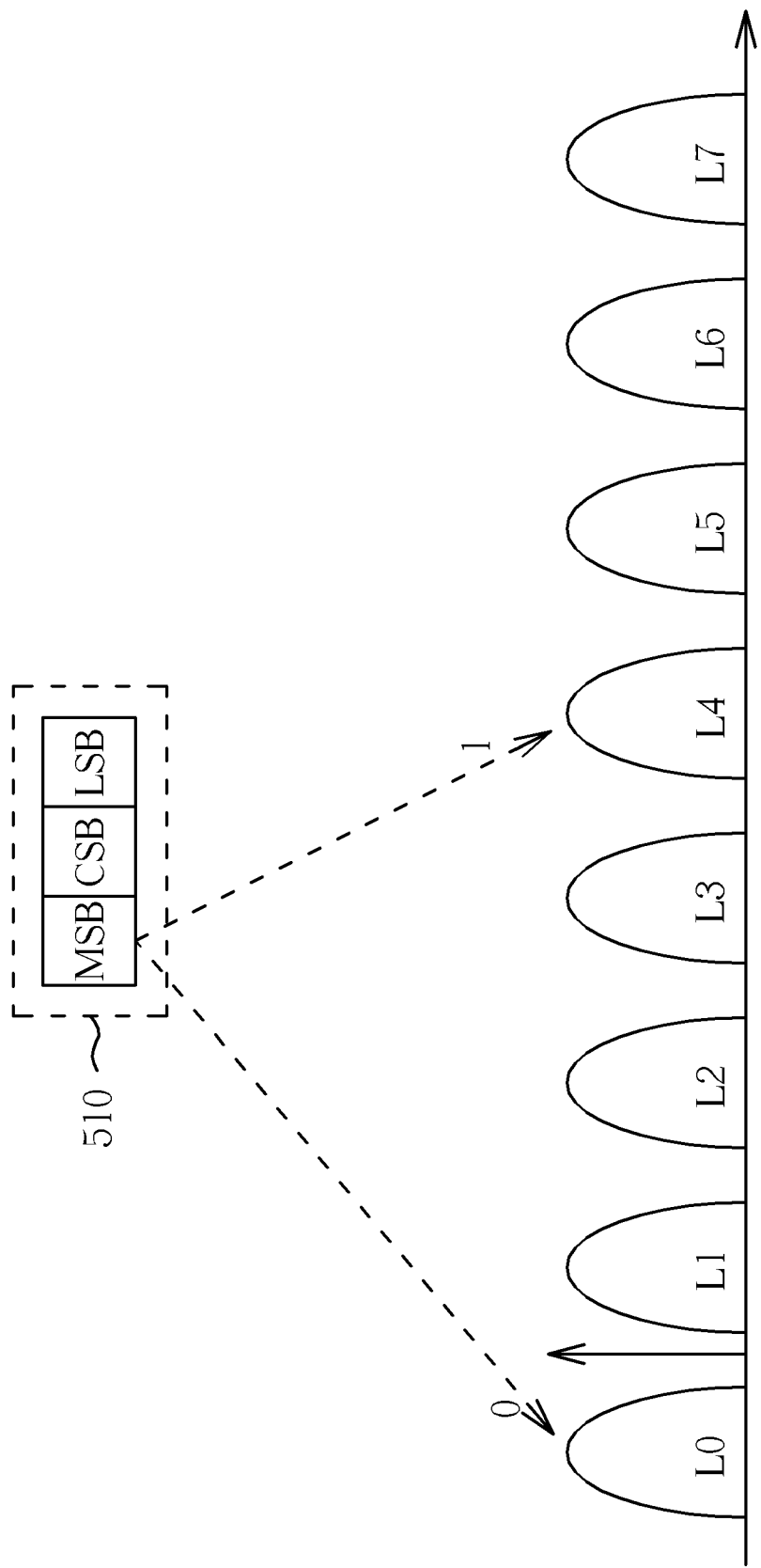
FIG. 5 illustrates bit information of a memory cell in the Flash memory shown in FIG. 1A and associated levels of the memory cell according to another embodiment of the present invention.

FIG. 5 illustrates bit information 510 of a memory cell in the Flash memory 120 shown in FIG. 1A and associated levels {L0, L1, L2, L3, L4, L5, L6, L7} of the memory cell according to another embodiment of the present invention, where the bit information 510 comprises a most significant bit MSB, a central significant bit CSB, and a least significant bit LSB. According to this embodiment, if the most significant bit MSB is equal to 1 and the other bits CSB and LSB are equal to 0, the storage level of the memory cell is the $4^{th}$ level L4. In addition, if the most significant bit MSB and the other bits CSB and LSB are all equal to 0, the storage level of the memory cell is the $0^{th}$ level L0. Thus, with regard to respective possible binary values {000, 001, 010, 011, 100, 101, 110, 111} of the bit information 510, the storage levels of the memory cell are the corresponding levels {L0, L1, L2, L3, L4, L5, L6, L7}, respectively.

In this embodiment, the controller performs data shaping on certain bit(s) regarding the memory cell within the original data (e.g. the data D1), rather than all bits regarding the memory cell within the original data. More particularly, the controller performs data shaping on the most significant bit MSB regarding the memory cell within the original data, rather than the other bits regarding the memory cell within the original data, such as the central significant bit CSB and the least significant bit LSB regarding the memory cell within the original data. This is for illustrative purposes only, and is not meant to be a limitation of the present invention. According to a variation of this embodiment, the controller performs data shaping on the most significant bit MSB and the central significant bit CSB regarding the memory cell within the original data, rather than the other bit(s) regarding the memory cell within the original data (such as the least significant bit LSB regarding the memory cell within the original data). According to another variation of this embodiment, the controller performs data shaping on the most significant bit MSB and the secondary significant bit (which is the central significant bit CSB in this variation, for example), rather than the other bit(s) regarding the memory cell within the original data (such as the least significant bit LSB regarding the memory cell within the original data). According to the error occurrence probabilities of the respective bits of the memory cell, the controller can determine whether performing data shaping is required. For example, in the memory cell, the error occurrence probability of the most significant bit MSB is minimum among others of the bits. Thus, in contrast to the central significant bit CSB and the least significant bit LSB, the most significant bit MSB only requires the least bit count of ECC protection, so the controller is capable of arranging redundant storage space for storing the side information $I_{SIDE}$. Therefore, the controller can perform data shaping only on the most significant bit MSB.

It is an advantage of the present invention that, by properly designing the aforementioned data shaping module/data recovery module accompanied with associated data flow control (e.g. the data flow control disclosed in FIGS. 1A-1C), the present invention can properly perform data pattern management regarding data accessed by the controller, in order to reduce the probability of error occurrence. In addition, implementing according to any of the respective embodiments/variations disclosed above will not cause unreasonable additional costs, and even can save costs in contrast to the related art. Therefore, by implementing based upon one or more of the embodiments/variations disclosed above, the related art problems can be resolved without greatly increasing the overall costs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for writing data into a Flash memory, the method being executed by a controller of the Flash memory, the Flash memory comprising a plurality of blocks, the method comprising:
  receiving original data by the controller, wherein the original data comprises a plurality of bit information, and each bit information comprises a most significant bit, a central significant bit and a least significant bit;
  for each bit information, performing data shaping on the most significant bit regarding a memory cell of the Flash memory within the original data, rather than all bits regarding the memory cell within the original data, to adjust the most significant bit to generate shaped data;
  writing the shaped data into the Flash memory;
  wherein the step of performing data shaping on the most significant bit regarding the memory cell of the Flash memory comprises:
    obtaining a plurality of shaping codes;
    obtaining a plurality of metrics and trace back information corresponding to the original data and the shaping codes;
    utilizing the trace back information as side information, wherein the trace back information corresponding to a plurality stages, each stage comprises a plurality of sub-paths, the sub-paths of each stage represent the shaping codes, respectively, and the trace back information comprises one sub-path of each stage; and
    selecting at least one shaping code from the shaping codes according to the metrics for performing data shaping on the most significant bit to generate the shaped data.

2. A memory device, comprising:
  a Flash memory comprising a plurality of blocks; and
  a controller arranged to access the Flash memory and manage the plurality of blocks, and further receives original data, where the original data comprises a plurality of bit information, and each bit information comprises a most significant bit, a central significant bit and a least significant bit; and the controller further obtains a plurality of shaping codes, obtains a plurality of metrics and trace back information corresponding to the original data and the shaping codes, and utilizes the trace back information as side information, where the trace back information corresponding to a plurality stages, each stage comprises a plurality of sub-paths, the sub-paths of each stage represent the shaping codes, respectively, and the trace back information comprises one sub-path of each stage, and the controller comprises:
    at least one data shaping module/data recovery module arranged to select at least one shaping code from the shaping codes according to the metrics for performing data shaping on the most significant bit regarding a memory cell of the Flash memory within the original data, rather than all bits regarding the memory cell within the original data, to adjust the most significant bit to generate shaped data.

3. A controller of a memory device, the controller being utilized for accessing a Flash memory comprising a plurality of blocks, the controller comprising:
  a read only memory (ROM) arranged to store a program code;
  a microprocessor arranged to execute the program code to control access to the Flash memory and manage the plurality of blocks, wherein under control of the microprocessor, the controller performs data shaping regarding data accessed by the controller itself, wherein the controller receives original data, where the original data comprises a plurality of bit information, and each bit information comprises a most significant bit, a central significant bit and a least significant bit; and the controller further obtains a plurality of shaping codes, obtains a plurality of metrics and trace back information corresponding to the original data and the shaping codes, and utilizes the trace back information as side information, where the trace back information corresponding to a plurality stages, each stage comprises a plurality of sub-paths, the sub-paths of each stage represent the shaping codes, respectively, and the trace back information comprises one sub-path of each stage; and
  at least one data shaping module/data recovery module arranged to select at least one shaping code from the shaping codes according to the metrics for performing data shaping on the most significant bit regarding a memory cell of the Flash memory within the original data, rather than all bits regarding the memory cell within the original data, to adjust the most significant bit to generate shaped data.

* * * * *